(12) United States Patent
Kim et al.

(10) Patent No.: US 9,831,267 B2
(45) Date of Patent: Nov. 28, 2017

(54) THREE-DIMENSIONAL SEMICONDUCTOR DEVICE

(71) Applicants: Seulye Kim, Hwasung-si (KR); Ji-Hoon Choi, Seongnam-si (KR); Dongkyum Kim, Suwon-si (KR); Jung Ho Kim, Seongnam-si (KR); Jintae Noh, Yongin-si (KR); Eun-Young Lee, Suwon-si (KR)

(72) Inventors: Seulye Kim, Hwasung-si (KR); Ji-Hoon Choi, Seongnam-si (KR); Dongkyum Kim, Suwon-si (KR); Jung Ho Kim, Seongnam-si (KR); Jintae Noh, Yongin-si (KR); Eun-Young Lee, Suwon-si (KR)

(73) Assignee: Samsung Electronics Co., Ltd., Gyeonggi-do (KR)

(*) Notice: Subject to any disclaimer, the term of this patent is extended or adjusted under 35 U.S.C. 154(b) by 0 days.

(21) Appl. No.: 15/239,434

(22) Filed: Aug. 17, 2016

(65) Prior Publication Data

US 2017/0084626 A1    Mar. 23, 2017

(30) Foreign Application Priority Data

Sep. 22, 2015  (KR) ........................ 10-2015-0134073

(51) Int. Cl.

| H01L 27/115 | (2017.01) |
|---|---|
| H01L 23/528 | (2006.01) |
| H01L 21/768 | (2006.01) |
| H01L 23/522 | (2006.01) |
| H01L 27/11582 | (2017.01) |
| H01L 27/11565 | (2017.01) |

(52) U.S. Cl.
CPC .. *H01L 27/11582* (2013.01); *H01L 21/76816* (2013.01); *H01L 21/76843* (2013.01); *H01L 21/76877* (2013.01); *H01L 27/11565* (2013.01)

(58) Field of Classification Search
CPC .......... H01L 27/11551; H01L 27/1157; H01L 27/11582; H01L 27/11524; H01L 29/7926;
(Continued)

(56) References Cited

U.S. PATENT DOCUMENTS

| 7,679,133 B2 | 3/2010 | Son et al. |
|---|---|---|
| 8,034,705 B2 | 10/2011 | Choi et al. |

(Continued)

FOREIGN PATENT DOCUMENTS

| KR | 100312384 B1 | 11/2001 |
|---|---|---|
| KR | 100466191 B1 | 1/2005 |
| KR | 100474507 B1 | 3/2005 |

*Primary Examiner* — Jasmine Clark
(74) *Attorney, Agent, or Firm* — Harness, Dickey & Pierce, P.L.C.

(57) ABSTRACT

A three-dimensional semiconductor device includes a plurality of stack structures extending in one direction on a substrate and spaced apart from each other, a plurality of vertical structures penetrating the stack structures, a common source plug between the stack structures that are adjacent to each other and extending in parallel to the stack structures, and a spacer structure at each side of the common source plug. The stack structure has a sidewall defining recess regions vertically spaced apart from each other. The spacer structure covers sidewalls of the stack structures. The spacer structure includes an insulating spacer and a protection spacer. The insulating spacer fills the recess regions of the stack structure and includes a surface having grooves. The protection spacer fills the grooves of the surface of the insulating spacer and has a substantially flat surface.

20 Claims, 25 Drawing Sheets

(58) Field of Classification Search
CPC ........... H01L 2924/00; H01L 27/11578; H01L 29/66666; H01L 21/76816; H01L 27/11565; H01L 21/76877; H01L 27/11529; H01L 2924/0002; H01L 2224/32145; H01L 29/7889; H01L 27/249; H01L 27/0688; H01L 21/76843; H01L 23/528; H01L 23/5226; H01L 21/76831

See application file for complete search history.

(56) References Cited

U.S. PATENT DOCUMENTS

| | | |
|---|---|---|
| 8,553,466 B2 | 10/2013 | Han et al. |
| 8,559,235 B2 | 10/2013 | Yoon et al. |
| 8,654,587 B2 | 2/2014 | Yoon et al. |
| 9,030,885 B2 | 5/2015 | Wakchaure et al. |
| 9,082,653 B2 | 7/2015 | Han et al. |
| 9,093,480 B2 | 7/2015 | Makala et al. |
| 9,117,539 B2 | 8/2015 | Lee |
| 9,679,650 B1 * | 6/2017 | Sakui .................. G11C 16/08 |
| 2006/0054949 A1 | 3/2006 | Ichimori |
| 2008/0217775 A1 | 9/2008 | Pai et al. |
| 2010/0015801 A1 | 1/2010 | Choi et al. |
| 2011/0233648 A1 | 9/2011 | Seol et al. |
| 2014/0295636 A1 | 10/2014 | Makala et al. |
| 2015/0024592 A1 | 1/2015 | Chandrashekar et al. |
| 2015/0063029 A1 | 3/2015 | Lee |
| 2015/0078088 A1 | 3/2015 | Wakchaure et al. |
| 2015/0084109 A1 | 3/2015 | Han et al. |
| 2015/0088681 A1 | 3/2015 | Gladstone et al. |
| 2017/0154895 A1 * | 6/2017 | Huo .................. H01L 27/11582 |

* cited by examiner

THREE-DIMENSIONAL SEMICONDUCTOR DEVICE

CROSS-REFERENCE TO RELATED APPLICATION

This U.S. non-provisional patent application claims priority under 35 U.S.C. §119 to Korean Patent Application No. 10-2015-0134073, filed on Sep. 22, 2015, in the Korean Intellectual Property Office, the disclosure of which is hereby incorporated by reference in its entirety.

BACKGROUND

Example embodiments of inventive concepts relate to three-dimensional (3D) semiconductor devices and, more particularly, to 3D semiconductor devices capable of improving reliability.

Semiconductor devices have been highly integrated to provide high performance and low costs. The integration density of semiconductor devices may affect the costs of the semiconductor devices, thereby resulting in a demand of a highly integrated semiconductor device. An integration density of a conventional two-dimensional (2D) or planar semiconductor device may be mainly determined by an area where a unit memory cell occupies. Therefore, the integration density of the conventional 2D semiconductor device may be greatly affected by a technique of forming fine patterns. However, since extremely high-priced apparatuses are used to form fine patterns, the integration density of 2D semiconductor devices continues to increase but is still limited. Thus, three-dimensional (3D) semiconductor devices including three-dimensionally arranged memory cells have been developed.

SUMMARY

Example embodiments of inventive concepts may provide three-dimensional (3D) semiconductor devices capable of improving reliability.

According to example embodiments of inventive concepts, a 3D semiconductor device may include a plurality of stack structures extending in one direction on a substrate and spaced apart from each other, each of the stack structures having a sidewall defining recess regions vertically spaced apart from each other; a plurality of vertical structures penetrating the stack structures; a common source plug between the stack structures adjacent to each other and extending in parallel to the stack structures; and a spacer structure at each side of the common source plug between the common source plug and the stack structures. The spacer structure covers the sidewalls of the stack structures. The spacer structure may include an insulating spacer and a protection spacer. The insulating spacer fills the recess regions of the sidewall of the stack structures. A surface of the insulating spacer defines grooves. The protection spacer fills the grooves of the surface of the insulating spacer. The protection spacer has a substantially flat surface.

In example embodiments, the substantially flat surface of the protection spacer may be in contact with the common source plug.

In example embodiments, the common source plug may include a metal layer between the stack structures that are adjacent to each other, and a barrier metal layer conformally covering a bottom surface and sidewalls of the metal layer. The barrier metal layer may be in contact with the substantially flat surface of the protection layer.

In example embodiments, each of the stack structures may include insulating layers and electrodes alternately and vertically stacked on the substrate. Sidewalls of the electrodes may be laterally recessed from sidewalls of the insulating layers to define the recess regions. The insulating spacer may include first portions adjacent to the electrodes and second portions adjacent to the insulating layers. A horizontal distance between a surface of the first portions and a surface of the second portions may be smaller than a horizontal distance between the sidewall of the insulating layer adjacent to the insulating spacer and the sidewall of the electrode adjacent to the insulating spacer.

In example embodiments, the insulating spacer may be formed of silicon oxide, and the protection spacer may be formed of one of silicon, germanium, and silicon-germanium.

In example embodiments, the protection spacer may include a first protection spacer filling the grooves of the insulating spacer, and a second protection spacer between the first protection spacer and the common source plug and having the substantially flat surface.

In example embodiments, the first protection spacer may be formed of silicon, and the second protection spacer may be formed of silicon oxide.

In example embodiments, the 3D semiconductor device may further include a data storage layer between the vertical structures and the stack structures. Each of the stack structures may include insulating layers and electrodes alternately and vertically stacked on the substrate. The data storage layer may include a vertical insulating pattern and a horizontal pattern. The vertical insulating pattern may penetrate the stack structures to surround the vertical structures. The horizontal insulating pattern may laterally extend from between the vertical insulating pattern and each of the electrodes into between the each of the electrodes and the insulating layers.

In example embodiments, the horizontal insulating pattern may further extend into between the spacer structure and the insulating layers.

In example embodiments, the 3D semiconductor device may further include a common source region formed in the substrate between the stack structures adjacent to each other. The common source plug may be in contact with the common source region.

According to example embodiments of inventive concepts, a 3D semiconductor device may include a plurality of stack structures extending in one direction on a substrate and spaced apart from each other, each of the stack structures having a sidewall defining recess regions vertically spaced apart from each other; a plurality of vertical structures penetrating the stack structures; a common source plug between the stack structures adjacent to each other and extending in parallel to the stack structures; and a spacer structure between the common source plug and the stack structures. The spacer structure may be disposed at each side of the common source plug. The spacer structure may cover the sidewalls of the stack structures. The spacer structure may include an insulating spacer and a protection spacer. The insulating spacer may fill the recess regions of the sidewalls of the stack structures. A surface of the insulating spacer may define grooves. The protection spacer may fill the grooves of the insulating spacer and may be in contact with the common source plug. The protection spacer may include a different material from the insulating spacer.

In example embodiments, a surface of the protection spacer that contacts the common source plug may be substantially flat.

In example embodiments, the protection spacer may include a first protection spacer and a second protection spacer. The first protection spacer may fill the grooves of the insulating spacer. The second protection spacer may be between the first protection spacer and the common source plug and may have a substantially flat surface. The first protection spacer and the second protection spacer may be formed of different materials.

In example embodiments, the 3D semiconductor device may further include a data storage layer between the vertical structures and the stack structures. Each of the stack structures may include insulating layers and electrodes alternately and vertically stacked on the substrate. The data storage layer may include a vertical insulating pattern and a horizontal pattern. The vertical insulating pattern may penetrate the stack structure to surround the vertical structures. The horizontal insulating pattern may laterally extend from between the vertical insulating pattern and each of the electrodes into between the each of the electrodes and the insulating layers.

In example embodiments, each of the stack structures may include insulating layers and electrodes alternately and vertically stacked on the substrate. Sidewalls of the electrodes may be laterally recessed from sidewalls of the insulating layers to define the recess regions. The insulating spacer may include first portions and second portions. The first portions may be adjacent to the electrodes and the second portions may be adjacent to the insulating layers. A horizontal distance between a surface of the first portions and a surface of the second portions may be smaller than a horizontal distance between the sidewall of the insulating layer adjacent to the insulating spacer and the sidewall of the electrode adjacent to the insulating spacer.

According to example embodiments of inventive concepts, a method of manufacturing a 3D semiconductor device may include forming a plurality of stack structures on a substrate, each of the stack structures including insulating layers and electrodes alternately and vertically stacked on the substrate, each of the stack structures having a sidewall defining recess regions vertically spaced apart from each other; forming an insulating spacer filling the recess regions of the sidewalls of the stack structures, a surface of the insulating spacer defining grooves; forming a protection spacer filling the grooves of the surface of the insulating spacer; and forming a common source plug between the stack structures adjacent to each other. The common source plug may extend in parallel to the stack structures and may be in contact with a surface of the protection spacer.

In example embodiments, the forming the protection layer may include depositing a protection spacer layer with a uniform thickness on the surface of the insulating spacer, and etching a portion of a surface of the protection spacer layer to form the protection spacer having a substantially flat surface.

In example embodiments, the forming the protection layer may include depositing a first protection spacer layer with a uniform thickness on the surface of the insulating spacer, and forming a second protection spacer layer on the first protection spacer layer. The second protection spacer layer may be formed of a different material than the first protection spacer layer.

In example embodiments, the forming the stack structures may include forming a thin layer structure including the insulating layers and sacrificial layers alternately and vertically stacked on the substrate, forming trenches penetrating the thin layer structure to form a plurality of mold structures spaced apart from each other on the substrate, and replacing the sacrificial layers of the mold structures with the electrodes to define each of the recess regions between the insulating layers adjacent to each other.

In example embodiments, the forming the common source plug may include depositing a barrier metal layer on the surfaces of the protection spacers exposed by the trenches, and depositing a metal layer filling the trenches having the barrier metal layer.

According to example embodiments, a three-dimensional (3D) semiconductor device includes a plurality of cell strings on a substrate, word lines, bit lines, a common source line, a common source plug, a protection spacer, and an insulating spacer. Each of the cell strings includes a plurality of memory cells stacked on top of each other between a ground selection transistor and a string selection transistor. The word lines are connected to memory cells in the plurality of cell strings. The bit lines are connected to the cell strings. The common source line is connected to the cell strings. The common source plug is connected to the common source line. The common source plug extends vertical to a top surface of the substrate. The protection spacer surrounds the common source plug. The insulating spacer surrounds the protection spacer.

In example embodiments, the protection spacer may include a first protection spacer filling grooves defined by the insulating spacer, and a second protection spacer between the first protection spacer and the common source plug and having the substantially flat surface.

In example embodiments, the first protection spacer may be formed of silicon and the second protection spacer may be formed of silicon oxide.

In example embodiments, the protection spacer may include a first surface facing the common source plug and a second surface opposite the first surface. The first surface may be substantially flat. The second surface may include a plurality of concave portions.

In example embodiments, the insulating spacer may include first portions and second portions alternately arranged in a vertical direction. The first portions may extend further away from the common source plug than the second portions in a lateral direction. A thickness of the protection spacer may be greater between the common source plug and the first portions compared to a thickness of the protection spacer between the common source plug and the second portions.

BRIEF DESCRIPTION OF THE DRAWINGS

The foregoing and other features of inventive concepts will be apparent from the more particular description of non-limiting embodiments of inventive concepts, as illustrated in the accompanying drawings in which like reference characters refer to like parts throughout the different views. The drawings are not necessarily to scale, emphasis instead being placed upon illustrating principles of inventive concepts. In the drawings.

DETAILED DESCRIPTION OF EXAMPLE EMBODIMENTS

Figure 1:
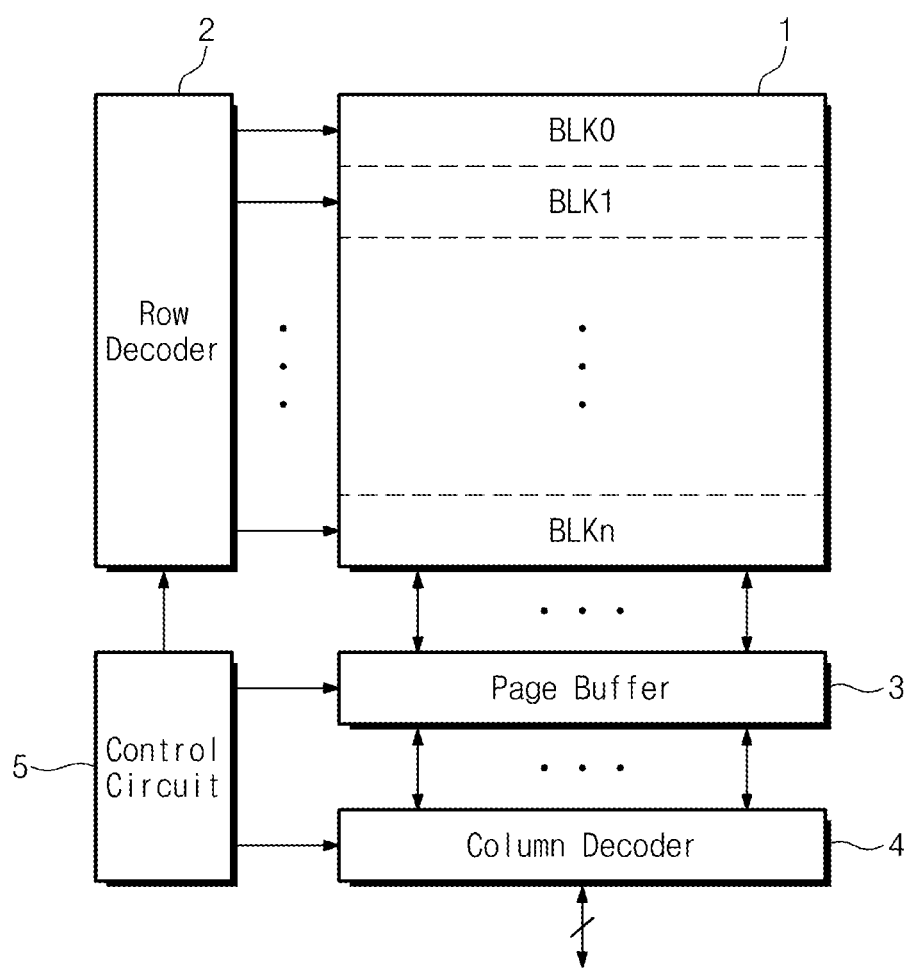
FIG. 1 is a schematic block diagram illustrating a three-dimensional (3D) semiconductor device according to example embodiments of inventive concepts.

Example embodiments will now be described more fully with reference to the accompanying drawings, in which some example embodiments are shown. Example embodiments, may, however, be embodied in many different forms and should not be construed as being limited to the embodiments set forth herein; rather, these example embodiments are provided so that this disclosure will be thorough and complete, and will fully convey the scope of example embodiments of inventive concepts to those of ordinary skill in the art. In the drawings, the thicknesses of layers and regions are exaggerated for clarity. Like reference characters and/or numerals in the drawings denote like elements, and thus their description may not be repeated.

Similarly, it will be understood that when an element such as a layer, region or substrate is referred to as being "on" another element, it can be directly on the other element or intervening elements may be present. In contrast, the term "directly" means that there are no intervening elements. Other words used to describe the relationship between elements or layers should be interpreted in a like fashion (e.g., "between" versus "directly between," "adjacent" versus "directly adjacent," "connected" versus "directly connected"). As used herein the term "and/or" includes any and all combinations of one or more of the associated listed items.

It will be understood that, although the terms "first", "second", etc. may be used herein to describe various elements, components, regions, layers and/or sections. These elements, components, regions, layers and/or sections should not be limited by these terms. These terms are only used to distinguish one element, component, region, layer or section from another element, component, region, layer or section. Thus, a first element, component, region, layer or section discussed below could be termed a second element, component, region, layer or section without departing from the teachings of example embodiments.

Spatially relative terms, such as "beneath," "below," "lower," "above," "upper" and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the term "below" can encompass both an orientation of above and below. The device may be otherwise oriented (rotated 90 degrees or at other orientations) and the spatially relative descriptors used herein interpreted accordingly.

The terminology used herein is for the purpose of describing particular embodiments only and is not intended to be limiting of example embodiments. As used herein, the singular forms "a," "an" and "the" are intended to include the plural forms as well, unless the context clearly indicates otherwise. It will be further understood that the terms "comprises", "comprising,", "includes" and/or "including", when used herein, specify the presence of stated features, integers, steps, operations, elements, and/or components, but do not preclude the presence or addition of one or more other features, integers, steps, operations, elements, components, and/or groups thereof. Expressions such as "at least one of," when preceding a list of elements, modify the entire list of elements and do not modify the individual elements of the list.

Additionally, example embodiments are described herein with reference to cross-sectional views and/or plan views that are idealized views. Accordingly, shapes of the illustrated embodiments may be modified according to manufacturing techniques and/or allowable errors. As such, variations from the shapes of the illustrations as a result, for example, of manufacturing techniques and/or tolerances, are to be expected. Thus, example embodiments should not be construed as limited to the particular shapes of regions illustrated herein but are to include deviations in shapes that result, for example, from manufacturing. For example, an etched region or an implanted region illustrated as a rectangle may have rounded or curved features. Thus, the regions illustrated in the figures are schematic in nature and their shapes are not intended to illustrate the actual shape of a region of a device and are not intended to limit the scope of example embodiments.

Unless otherwise defined, all terms (including technical and scientific terms) used herein have the same meaning as commonly understood by one of ordinary skill in the art to which example embodiments belong. It will be further understood that terms, such as those defined in commonly-used dictionaries, should be interpreted as having a meaning that is consistent with their meaning in the context of the relevant art and will not be interpreted in an idealized or overly formal sense unless expressly so defined herein.

Although corresponding plan views and/or perspective views of some cross-sectional view(s) may not be shown, the cross-sectional view(s) of device structures illustrated herein provide support for a plurality of device structures that extend along two different directions as would be illustrated in a plan view, and/or in three different directions as would be illustrated in a perspective view. The two different directions may or may not be orthogonal to each other. The three different directions may include a third direction that may be orthogonal to the two different directions. The plurality of device structures may be integrated in a same electronic device. For example, when a device structure (e.g., a memory cell structure or a transistor structure) is illustrated in a cross-sectional view, an electronic device may include a plurality of the device structures (e.g., memory cell structures or transistor structures), as would be illustrated by a plan view of the electronic device. The plurality of device structures may be arranged in an array and/or in a two-dimensional pattern.

Example embodiments of inventive concepts explained and illustrated herein include their complementary counterparts. The same reference numerals or the same reference designators denote the same elements throughout the specification.

FIG. 1 is a schematic block diagram illustrating a three-dimensional (3D) semiconductor device according to example embodiments of inventive concepts.

Referring to FIG. 1, a 3D semiconductor device may include a memory cell array 1, a row decoder 2, a page buffer 3, a column decoder 4, and a control circuit 5. The 3D semiconductor device may be a 3D semiconductor memory device.

The memory cell array 1 may include a plurality of memory blocks BLK0 to BLKn. Each of the memory blocks BLK0 to BLKn may include a plurality of memory cells, a plurality of word lines, and a plurality of bit lines. The word lines and the bit lines may be electrically connected to the memory cells.

The row decoder 2 may decode an address signal inputted from an external device to select one of the word lines. The address signal decoded in the row decoder 2 may be provided to a row driver (not shown). The row driver may provide a selected word line voltage and unselected word line voltages generated from a voltage generation circuit (not shown) to the selected word line and unselected word lines in response to a control signal of the control circuit 5. The row decoder 2 may be connected in common to the plurality of memory blocks BLK0 to BLKn and may provide driving signals to the word lines of a memory block selected by a block selection signal.

The page buffer 3 may be connected to the memory cell array 1 through the bit lines to sense data stored in the memory cells and/or write data to the memory cells. The page buffer 3 may be connected to a bit line selected by an address signal decoded in the column decoder 4. According to an operation mode, the page buffer 3 may temporarily store data to be stored in the memory cells or may sense data stored in the memory cells. For example, the page buffer 3 may be operated as a write driver during a program operation mode and may be operated as a sense amplifier during a sensing operation mode. The page buffer 3 may receive power (e.g., a voltage or a current) from the control circuit 5 and may provide the received power to the selected bit line.

The column decoder 4 may provide a data-transmitting path between the page buffer 3 and an external device (e.g., a memory controller). The column decoder 4 may decode an address signal inputted from the external device to select one of the bit lines. The column decoder 4 may be connected in common to the plurality of memory blocks BLK0 to BLKn and may provide data to the bit lines of the memory block selected by the block selection signal.

The control circuit 5 may control overall operations of the 3D semiconductor device. The control circuit 5 may receive control signals and an external voltage and may be operated in response to the received control signals. The control circuit 5 may include a voltage generator that generates voltages (e.g., a program voltage, a sensing voltage, and an erase voltage) used for inner operations of the 3D semiconductor device in response to the external voltage and/or control signals received by the control circuit 5. The control circuit 5 may control a read operation, a write operation, and/or an erase operation in response to the control signals.

Figure 2:
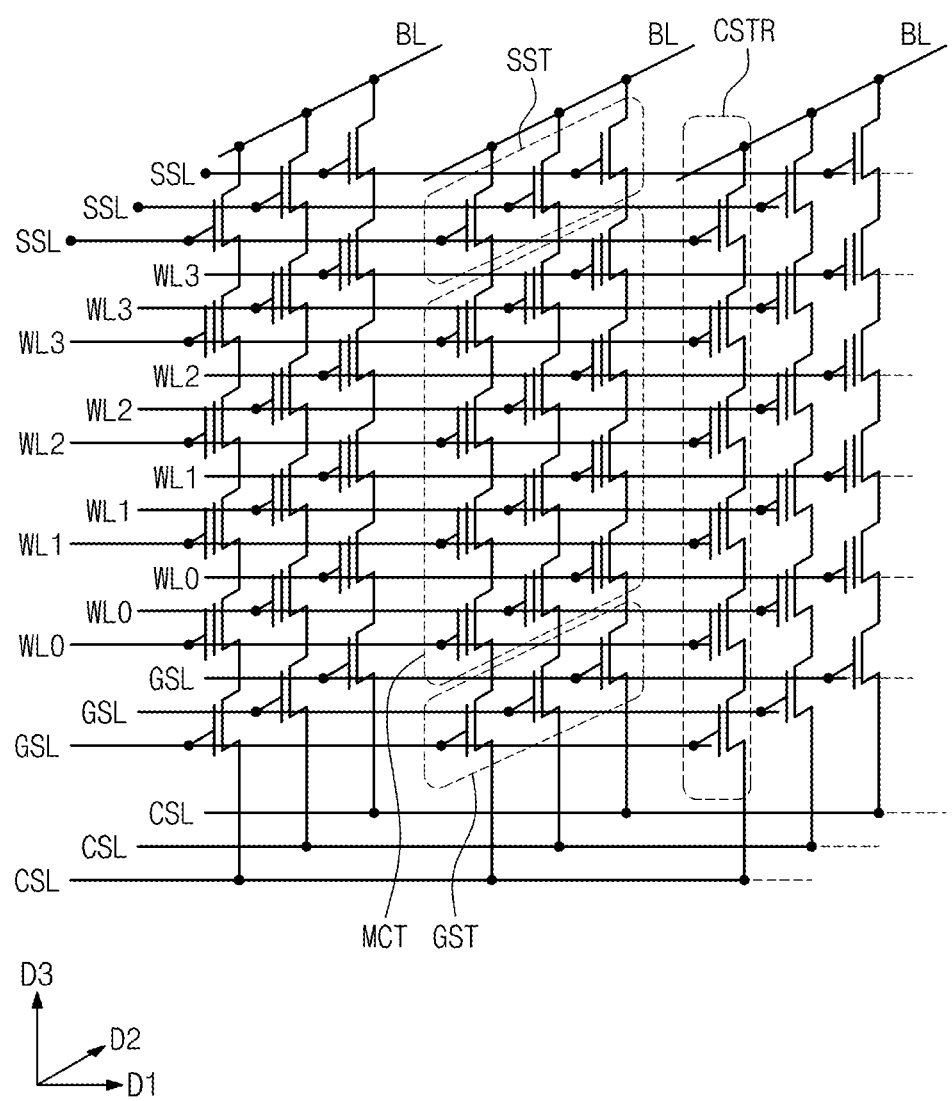
FIG. 2 is a circuit diagram illustrating a cell array of a 3D semiconductor device according to example embodiments of inventive concepts.

FIG. 2 is a circuit diagram illustrating a cell array of a 3D semiconductor device according to example embodiments of inventive concepts.

Referring to FIG. 2, a cell array of a 3D semiconductor device according to example embodiments of inventive concepts may include a common source line CSL, a plurality of bit lines BL, and a plurality of cell strings CSTR connected between the common source line CSL and the bit lines BL.

The bit lines BL may be two-dimensionally arranged. A plurality of the cell strings CSTR may be connected in parallel to each of the bit lines BL. The cell strings CSTR may be connected in common to the common source line CSL. In other words, a plurality of the cell strings CSTR may be disposed between one common source line CSL and the plurality of bit lines BL. In example embodiments, the common source line CSL may include a plurality of common source lines CSL two-dimensionally arranged. The same voltage may be applied to the plurality of the common source lines CSL, or the common source lines CSL may be electrically controlled independently of each other.

Each of the cell strings CSTR may include a ground selection transistor GST connected to the common source line CSL, a string selection transistor SST connected to the bit line BL, and a plurality of memory cell transistors MCT between the ground and string selection transistors GST and SST. The ground selection transistor GST, the memory cell transistors MCT, and the string selection transistor SST may be connected in series to each other in the order named.

The common source line CSL may be connected in common to sources of the ground selection transistors GST. A ground selection line GSL, a plurality of word lines WL0 to WL3 and a string selection line SSL which are disposed between the common source line CSL and the bit lines BL may be used as a gate electrode of the ground selection transistor GST, gate electrodes of the memory cell transistors MCT and a gate electrode of the string selection transistor SST, respectively. Each of the memory cell transistors MCT may include a data storage element.

Figure 3:
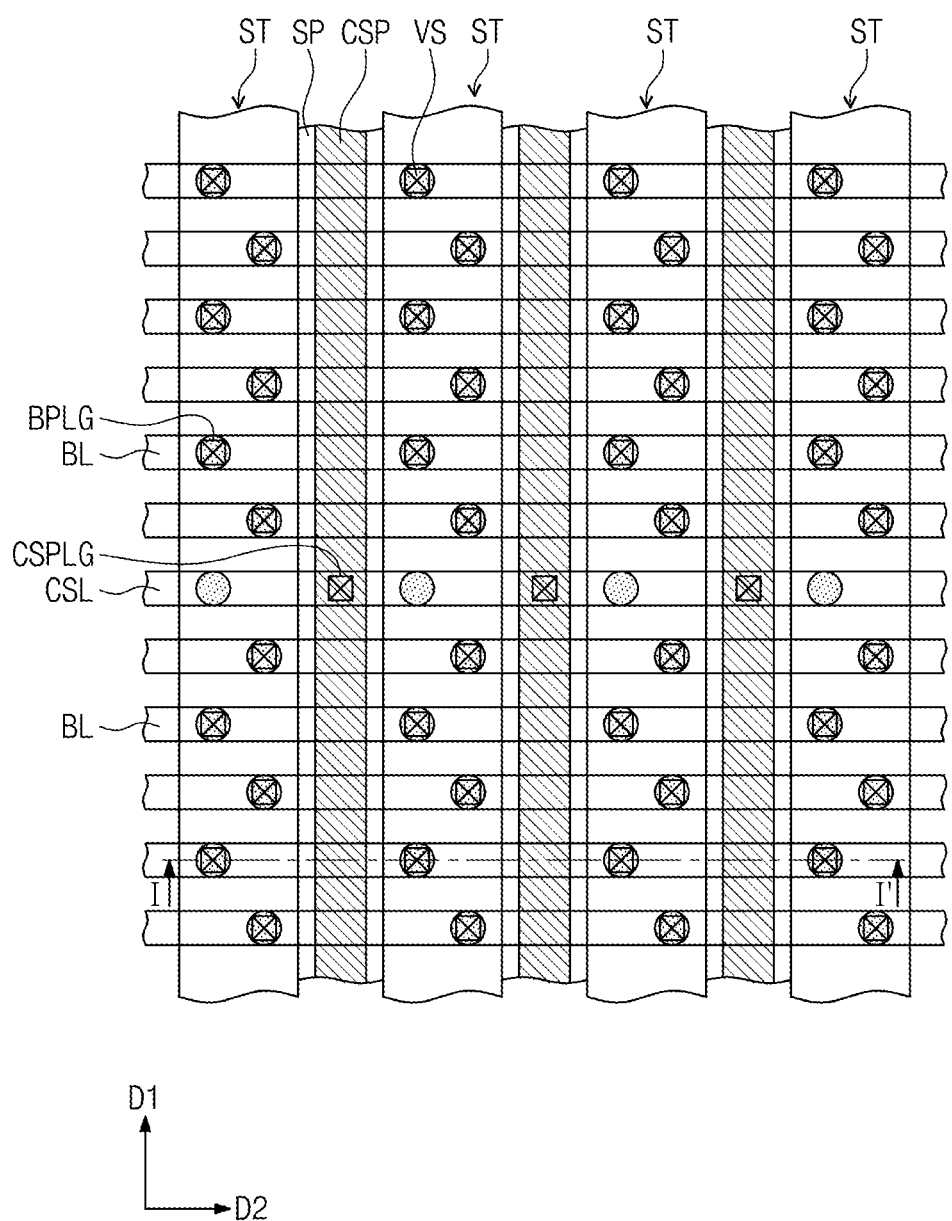
FIG. 3 is a plan view illustrating a 3D semiconductor device according to example embodiments of inventive concepts.

FIG. 3 is a plan view illustrating a 3D semiconductor device according to example embodiments of inventive concepts. FIGS. 4 to 12 are cross-sectional views taken along a line I-I' of FIG. 3 to illustrate a method of manufacturing a 3D semiconductor device according to example embodiments of inventive concepts.

Figure 4:
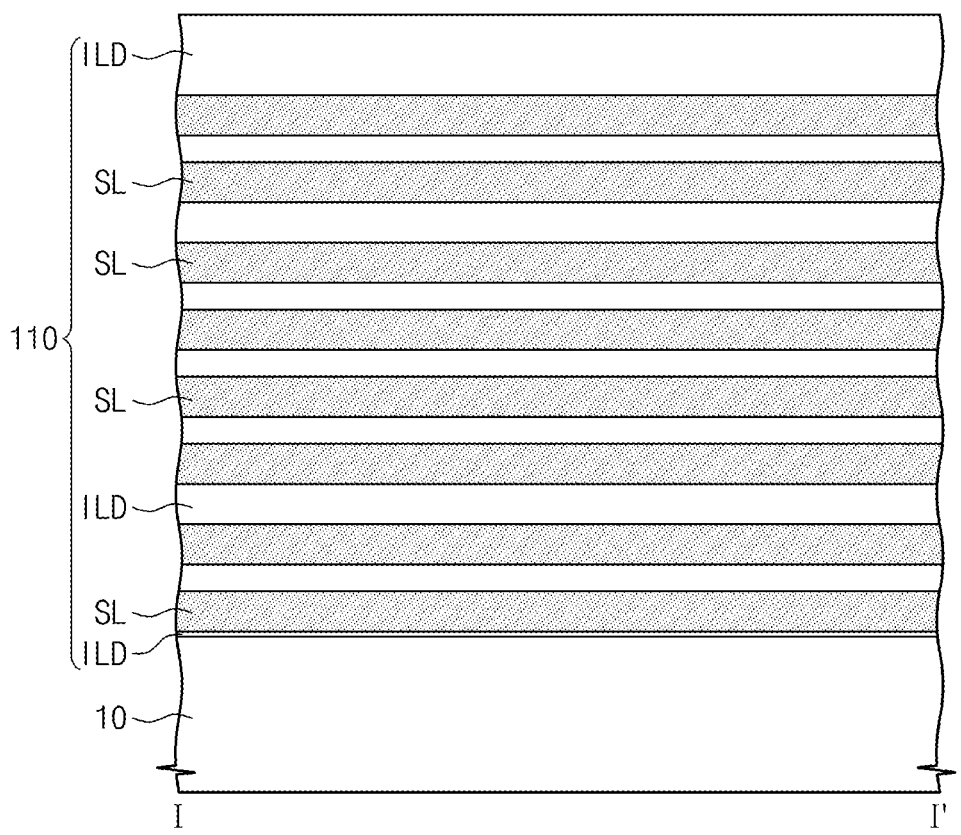
FIGS. 4 to 12 are cross-sectional views taken along a line I-I' of FIG. 3 to illustrate a method of manufacturing a 3D semiconductor device according to example embodiments of inventive concepts.

Referring to FIGS. 3 and 4, a thin layer structure 110 may be formed on substrate 10. The thin layer structure 110 may include sacrificial layers SL and insulating layers ILD which are alternately and repeatedly stacked on the substrate 10.

For example, the substrate 10 may be a semiconductor substrate or a semiconductor-on-insulator substrate. For example, the substrate 10 may be a bulk silicon substrate, a silicon-on-insulator (SOI) substrate, a germanium substrate, a germanium-on-insulator (GOI) substrate, a silicon-germanium substrate, or a substrate including an epitaxial layer obtained by performing a selective epitaxial growth (SEG) process.

In the thin layer structure 110, the sacrificial layers SL may be formed of a material having an etch selectivity with respect to the insulating layers ILD. For example, a difference between an etch rate of the sacrificial layers SL and an etch rate of the insulating layers ILD may be great in a wet etching process using a chemical solution, but a difference between an etch rate of the sacrificial layers SL and an etch rate of the insulating layers ILD may be small in a dry etching process using an etching gas.

In example embodiments, the sacrificial layers SL and the insulating layers ILD may be formed of insulating materials, and the sacrificial layers SL may have an etch selectivity with respect to the insulating layers ILD. For example, the sacrificial layers SL may include at least one of a silicon layer, a silicon oxide layer, a silicon carbide layer, a silicon-germanium layer, a silicon oxynitride layer, or a silicon nitride layer, but example embodiments are not limited thereto. The insulating layers ILD may include at least one of a silicon layer, a silicon oxide layer, a silicon carbide layer, a silicon oxynitride layer, a low-k dielectric layer, or a silicon nitride layer. At this time, the insulating layers ILD may include a different material than the sacrificial layers SL. For example, the sacrificial layers SL may be formed of silicon nitride layers, and the insulating layers ILD may be formed of low-k dielectric layers. Alternatively, the sacrificial layers SL may be formed of a conductive material, and the insulating layers ILD may be formed of an insulating material.

The sacrificial layers SL and the insulating layers ILD may be deposited using a thermal chemical vapor deposition (thermal CVD) technique, a plasma-enhanced CVD technique, a physical CVD technique, or an atomic layer deposition (ALD) technique.

In example embodiments, the sacrificial layers SL may have the same thickness. Alternatively, the lowermost one and the uppermost one of the sacrificial layers SL may be thicker than other sacrificial layers SL disposed therebetween. In example embodiments, the insulating layers ILD may have the same thickness, or one or more of the insulating layers ILD may have a different thickness from another or others of the insulating layers ILD. In example embodiments, the lowermost one of the insulating layers ILD of the thin layer structure 110 may be thinner than the sacrificial layers SL and other insulating layers ILD disposed thereon. The lowermost insulating layer ILD may be a silicon oxide layer formed by a thermal oxidation process.

Figure 5:
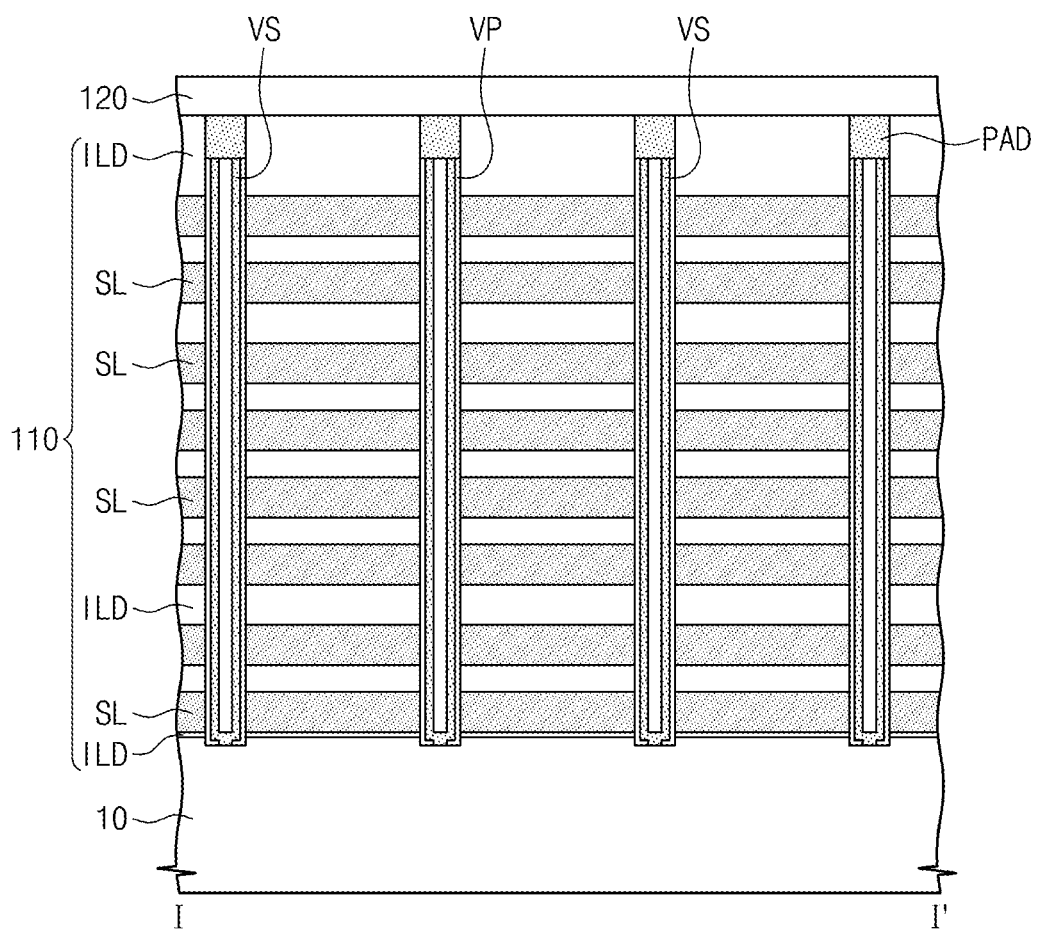

Referring to FIGS. 3 and 5, vertical structures VS may be formed to penetrate the thin layer structure 110. The vertical structures VS may be connected to the substrate 10. The vertical structures VS may include a semiconductor material or a conductive material.

In example embodiments, forming the vertical structures VS may include forming openings penetrating the thin layer structure 110, and forming semiconductor patterns in the openings, respectively. Forming the openings may include forming a mask pattern (not shown) on the thin layer structure 110, and anisotropically etching the thin layer structure 110 using the mask pattern (not shown) as an etch mask. In the anisotropic etching process, the substrate 10 exposed through the openings may be recessed by a limited (and/or alternatively predetermined) depth due to over-etching. In example embodiments, a width of a lower portion of each of the openings may be smaller than that of an upper portion of each of the openings. In example embodiments, the openings may be arranged in a matrix form along first and second directions D1 and D2 when viewed from a plan view. In example embodiments, the openings constituting two columns which are adjacent to each other and are parallel to the first direction D1 may be arranged in a zigzag form along the first direction D1 when viewed from a plan view.

Forming the semiconductor patterns in the openings may include forming a first semiconductor pattern exposing the substrate 10 and covering an inner sidewall of each of the openings, and forming a second semiconductor pattern connected to the substrate 10 and the first semiconductor pattern in each of the openings. Each of the vertical structures VS may include the second semiconductor pattern connected to the substrate 10 and the first semiconductor pattern disposed between the semiconductor pattern and the inner sidewall of each of the openings. The second semiconductor pattern may have a pipe or macaroni shape having a closed bottom end. An inner space of the second semiconductor pattern may be filled with a filling insulation pattern. The second semiconductor pattern may be in contact with an inner sidewall of the first semiconductor pattern and the top surface of the substrate 10. The first and second semiconductor patterns may include silicon (Si), germanium (Ge), or a combination thereof. The first and second semiconductor patterns may include a semiconductor doped with dopants or an undoped intrinsic semiconductor. The semiconductor pattern including the first and second semiconductor patterns may have a crystal structure including at least one of a single-crystalline structure, an amorphous structure, or a poly-crystalline structure.

A conductive pad PAD may be disposed on a top end of each of the vertical structures VS. The conductive pad PAD may be a dopant region doped with dopants or may be of a conductive material. Bottom surfaces of the conductive pads PAD may be higher than a top surface of the uppermost sacrificial layer SL.

In example embodiments, a vertical insulating pattern VP may be formed in each of the openings before the formation of the vertical structures VS. The vertical insulating pattern VP may consist of a single layer or a plurality of thin layers. According to example embodiments of inventive concepts, the vertical insulating pattern VP may be a portion of a data storage layer of a charge trap-type flash memory transistor. The data storage layer will be described later in more detail with reference to FIGS. 16A to 16E.

After the formation of the vertical structures VS, a capping dielectric layer 120 may be formed to cover the vertical structures VS and a top surface of the thin layer structure 110.

Figure 6:
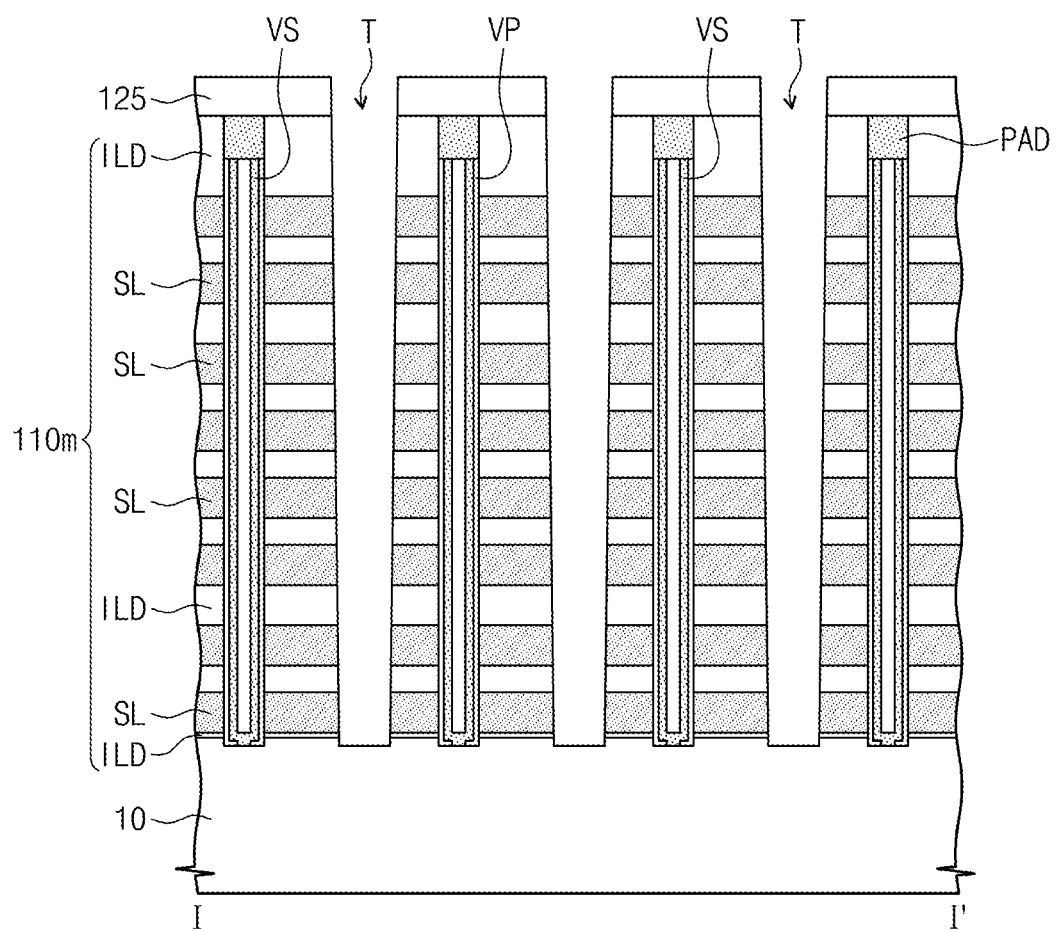

Referring to FIGS. 3 and 6, the capping dielectric layer 120 and the thin layer structure 110 may be patterned to form trenches T exposing the substrate 10 between the vertical structures VS.

Forming the trenches T may include forming a mask pattern (not shown) defining planar positions of the trenches T on the capping dielectric layer 120, and anisotropically etching the capping dielectric layer 120 and the thin layer structure 110 using the mask pattern (not shown) as an etch mask.

The trenches T may be laterally spaced apart from the vertical structures VS and may expose sidewalls of the insulating layers ILD and sidewalls of the sacrificial layers SL. Each of the trenches T may have a linear or rectangular shape extending in the first direction D1 in a plan view and may expose the top surface of the substrate 10 in a cross-sectional view. When the trenches T are formed, the substrate 10 under the trenches T may be recessed by a limited (and/or alternatively predetermined) depth due to over-etching. In example embodiments, each of the trenches T may have an inclined sidewall.

Since the trenches T are formed, the thin layer structure 110 may be divided into a plurality of mold structures 110m. In addition, a capping insulating pattern 125 may be formed on each of the mold structures 110m. The mold structures 110m may have liner shapes extending in the first direction D1 and may be spaced apart from each other in the second direction D2. Sidewalls of the mold structures 110m may be exposed through the trenches T. A plurality of the vertical structures VS may penetrate each of the mold structures 110m, and a portion of the substrate 10 may be exposed between the mold structures 110m adjacent to each other.

Figure 7:
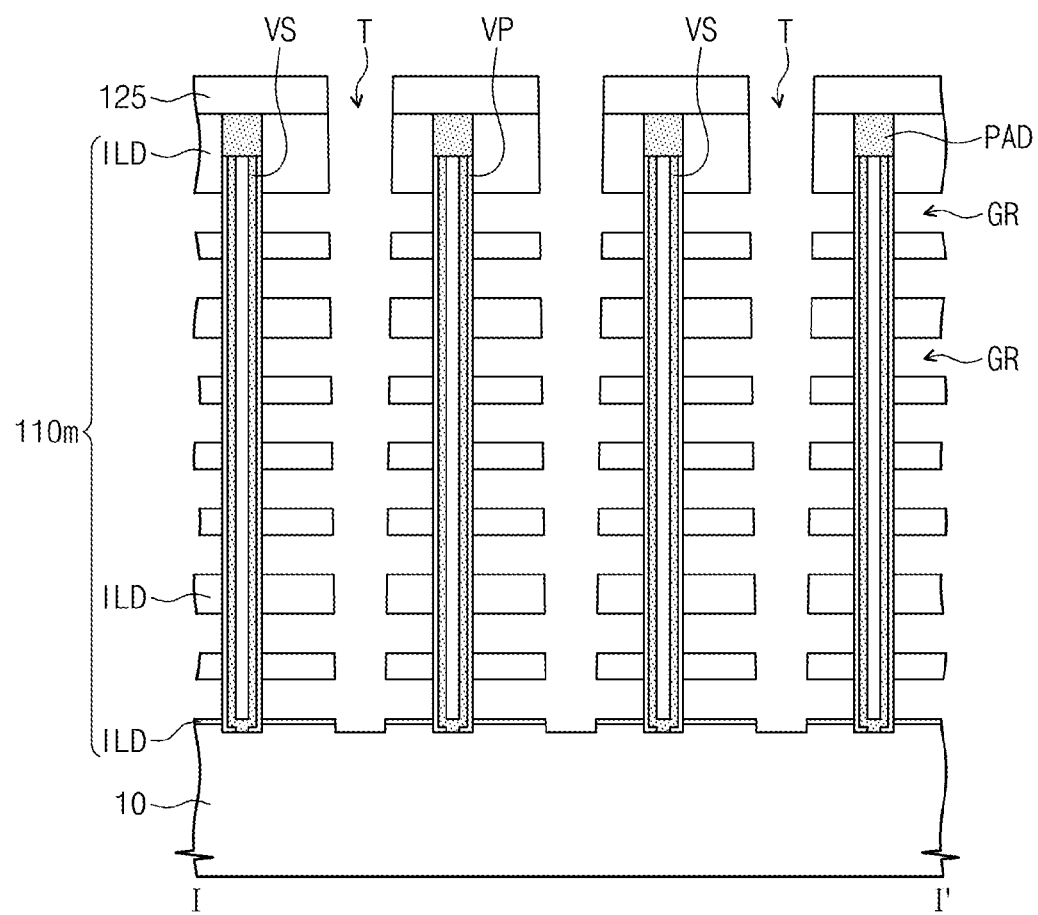

Referring to FIGS. 3 and 7, the sacrificial layers SL exposed through the trenches T may be removed to form gate regions GR between the insulating layers ILD.

The gate regions GR may be formed by isotropically etching the sacrificial layers SL using an etch recipe having an etch selectivity with respect to the insulating layers ILD, the vertical structures VS, the vertical insulating patterns VP, and the substrate 10. Here, the sacrificial layers SL may be completely removed by the isotropic etching process. For example, in the event that the sacrificial layers SL are silicon nitride layers and the insulating layers ILD are silicon oxide layers, the sacrificial layers SL may be removed by the isotropic etching process using an etching solution including phosphoric acid. In addition, the vertical insulating patterns VP may be used as an etch stop layer in the isotropic etching process for forming the gate regions GR. The gate regions GR may laterally extend from the trench T into between the insulating layers ILD and may expose portions of sidewalls of the vertical insulating patterns VP or portions of sidewalls of the vertical structures VS. In other words, each of the gate regions GR may be defined by the sidewall of the vertical insulating pattern VP and the insulating layers ILD vertically adjacent to each other.

Figure 8:
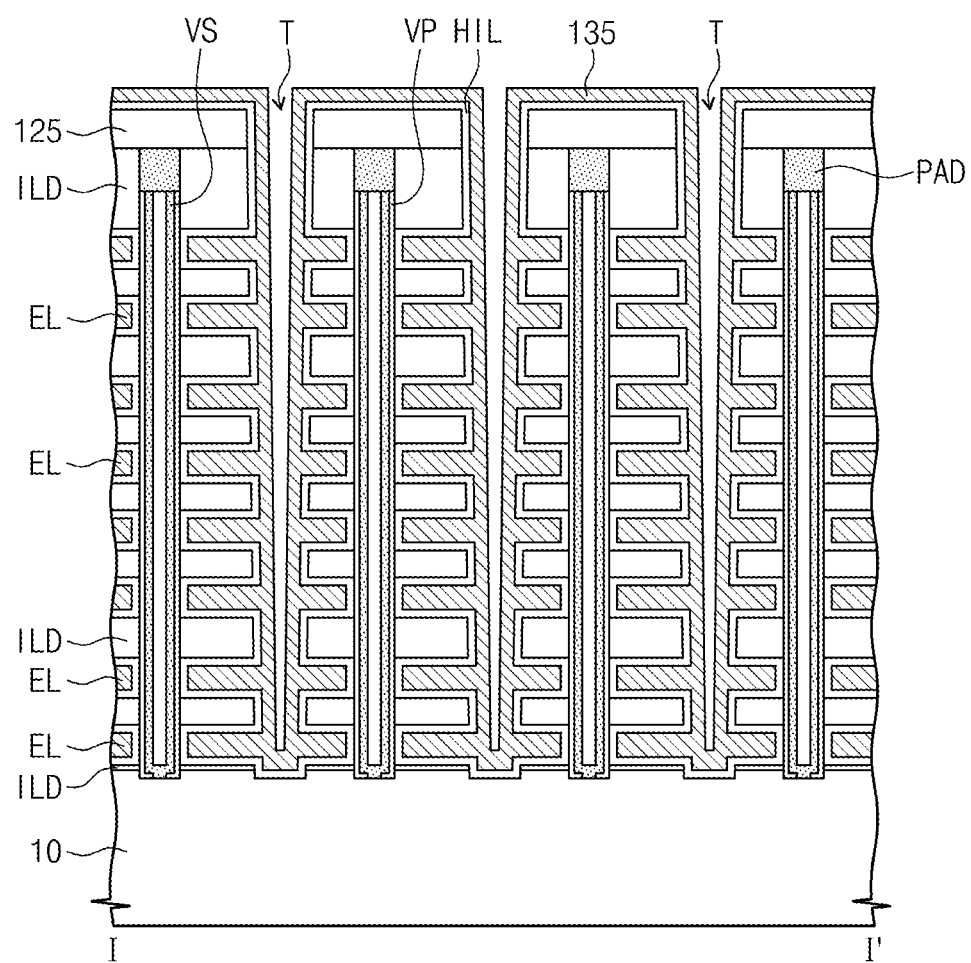

Referring to FIGS. 3 and 8, a horizontal insulating layer HIL may be formed to conformally cover inner surfaces of the gate regions GR.

The horizontal insulating layer HIL may be formed to have a substantially uniform thickness on a surface of the mold structure 110m having the gate regions GR. The horizontal insulating layer HIL may cover the portions of the vertical insulating pattern VP exposed through the gate regions GR.

The horizontal insulating layer HIL may consist of a single layer or a plurality of thin layers. In example embodiments, the horizontal insulating layer HIL may be a portion of the data storage layer of the charge trap-type flash memory transistor. The data storage layer will be described later in more detail with reference to FIGS. 16A to 16E.

Subsequently, a gate conductive layer 135 may be formed to fill the gate regions GR in which the horizontal insulating layer HIL is formed. The gate conductive layer 135 may partially or completely fill the trench T. In example embodiments, the gate conductive layer 135 may include a barrier metal layer and a metal layer which are sequentially deposited. For example, the barrier metal layer may include a metal nitride layer such as a titanium nitride (TiN) layer, a tantalum nitride (TaN) layer, or a tungsten nitride (WN) layer. For example, the metal layer may include at least one of metal materials such as W, Al, Ti, Ta, Co, and Cu.

Figure 9:
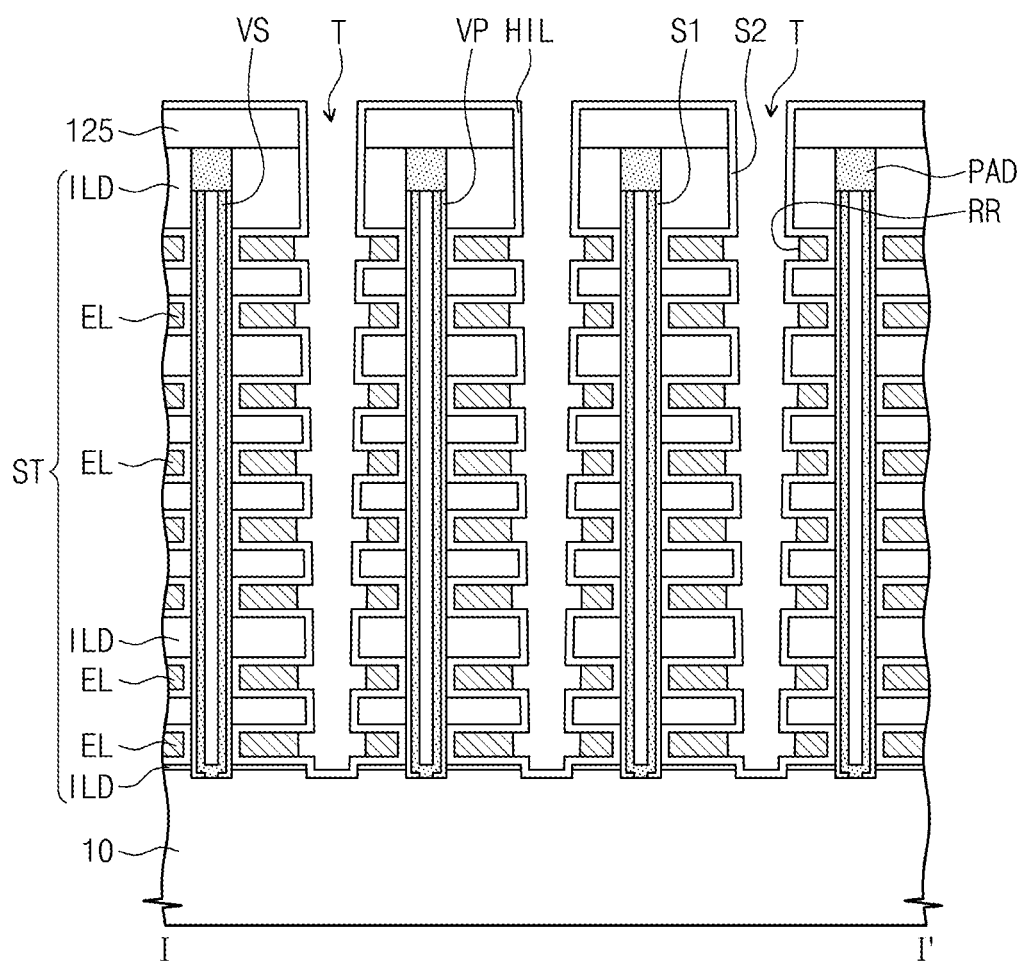

Referring to FIGS. 3 and 9, a portion of the gate conductive layer 135 formed in the trenches T may be removed to form the electrodes EL in the gate regions GR, respectively. At this time, a portion of the gate conductive layer 135 disposed on top surfaces of the mold structures 110m may also be removed.

In example embodiments, the electrodes EL may be formed by anisotropically etching the gate conductive layer 135 deposited in the trenches T. Alternatively, the electrodes EL may be formed by isotropically etching the gate conductive layer 135 deposited in the trenches T. The horizontal insulating layer HIL may be used as an etch stop layer in the process of etching the gate conductive layer 135, and thus the horizontal insulating layer HIL deposited on the sidewalls of the insulating layers ILD may be exposed by the trenches T after the formation of the electrodes EL. Sidewalls of the electrodes EL may be laterally recessed from the sidewalls of the insulating layers ILD.

Since the portions of the gate conductive layer 135 disposed in the trenches T are removed as described above, stack structures ST may be formed. Each of the stack structures ST may include the insulating layers ILD and the electrodes EL which are alternately and repeatedly stacked. The stack structures ST may extend in the first direction D1, and sidewalls of the stack structures ST may be exposed by the trenches T. In addition, the substrate 10 may be exposed between the stack structures ST adjacent to each other.

In more detail, each of the stack structures ST may have a first sidewall 51 adjacent to the vertical structure VS and a second sidewall S2 exposed by the trench T. The second sidewall S2 of the stack structure ST may have a plurality of recess regions RR of which each is disposed between the insulating layers ILD vertically adjacent to each other. Each of the recess regions RR may be defined by the insulating layers ILD adjacent to each other and the electrode EL interposed therebetween. In other words, a width in the second direction D2 of each of the insulating layer ILD may be greater than a width in the second direction D2 of each of the electrodes EL.

Figure 10:
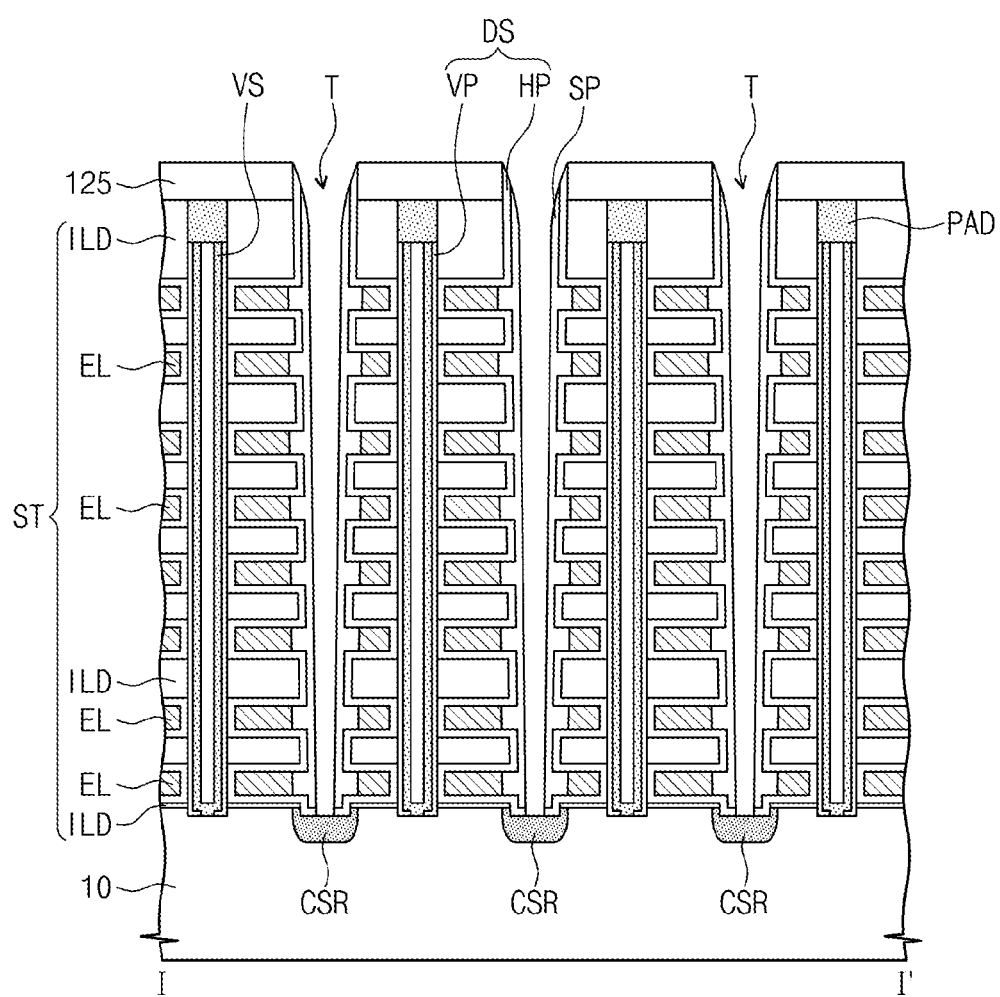

Referring to FIGS. 3 and 10, spacer structures SP may be formed in the trenches T to cover the sidewalls of the stack structures ST.

The spacer structures SP may cover the second sidewalls S2 of the stack structures ST and may expose a portion of the substrate 10 between the stack structures ST. The spacer structure SP may fill the recess regions RR of the second sidewall S2 of the stack structure ST. A surface of the spacer structure SP, which is exposed by the trench T, may be vertically substantially flat.

In example embodiments, the spacer structure SP may include a plurality of thin layers and may include at least one insulating layer. In example embodiments, forming the spacer structure SP may include forming a spacer layer with a uniform thickness on the substrate 10 having the stack structures ST, and performing an etch-back process on the spacer layer to expose the substrate 10. Here, a thickness of the spacer structure SP disposed on a sidewall of an upper portion of the stack structure ST may be reduced by the etch-back process. In other words, as illustrated in FIG. 10, the thickness of an upper portion of the spacer structure SP may be progressively less toward a top end of the spacer structure SP adjacent to the top surface of the uppermost insulating layer ILD.

Methods of forming the spacer structure SP according to example embodiments of inventive concepts will be described later in more detail with reference to FIGS. 13A to 13D, 14A to 14C, and 15.

Referring again to FIG. 10, when the spacer structure SP is formed, a portion of the horizontal insulating layer HIL disposed on the bottom surface of each of the trenches T may be removed to expose the substrate 10. Since the portions of the horizontal insulating layer HIL are removed, the horizontal insulating layer HIL may be divided into horizontal insulating patterns HP. The vertical insulating pattern VP and the horizontal insulating pattern HP may constitute a data storage layer DS. Common source regions CSR may be formed in the substrate 10 exposed under the trenches ST. The common source regions CSR may extend in the first direction D1 and may be spaced apart from each other in the second direction D2. The common source regions CSR may be formed by injecting dopants into the substrate 10. At this time, the dopants of the common source regions CSR may have a different conductivity type from the substrate 10. In example embodiments, the common source regions CSR may be formed before or after the formation of the spacer structures SP.

Figure 11:
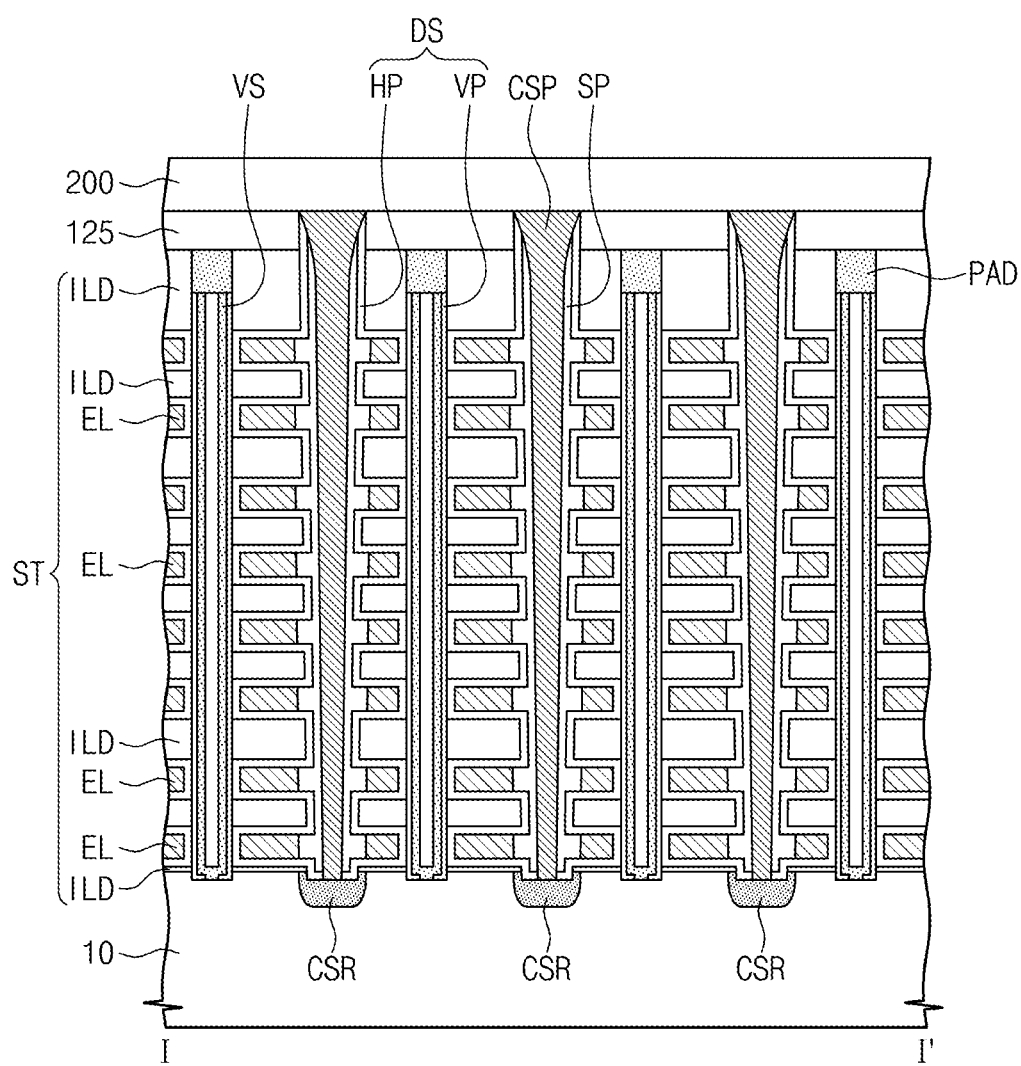

Referring to FIGS. 3 and 11, common source plugs CSP may be respectively formed in the trenches T in which the spacer structures SP are formed. In example embodiments, the common source plug CSP may be disposed between the stack structures ST adjacent to each other, and the spacer structures SP may be disposed between the common source plug CSP and the stack structures ST, respectively. In other words, the spacer structures SP may cover both sidewalls of the common source plug CSP. The common source plug CSP may extend in parallel to the electrodes EL along the first direction D1.

Since the thickness of the spacer structure SP on the sidewall of the upper portion of the stack structure ST is reduced, the common source plug CSP may have the maximum width at its top surface. In other words, a width of an upper portion of the common source plug CSP adjacent to the uppermost insulating layer ILD may be progressively greater toward the top surface of the common source plug CSP. The top surface of the common source plug CSP may be substantially coplanar with a top surface of the capping insulating pattern 125. In addition, the common source plug CSP may have the minimum width at its bottom surface being in contact with the common source region CSR. In other words, a width of an upper portion of the common source plug CSP may be progressively less toward the top surface of the common source regions CSR.

An upper filling insulation layer 200 may be formed on the stack structures ST and the common source plugs CSP.

Figure 12:
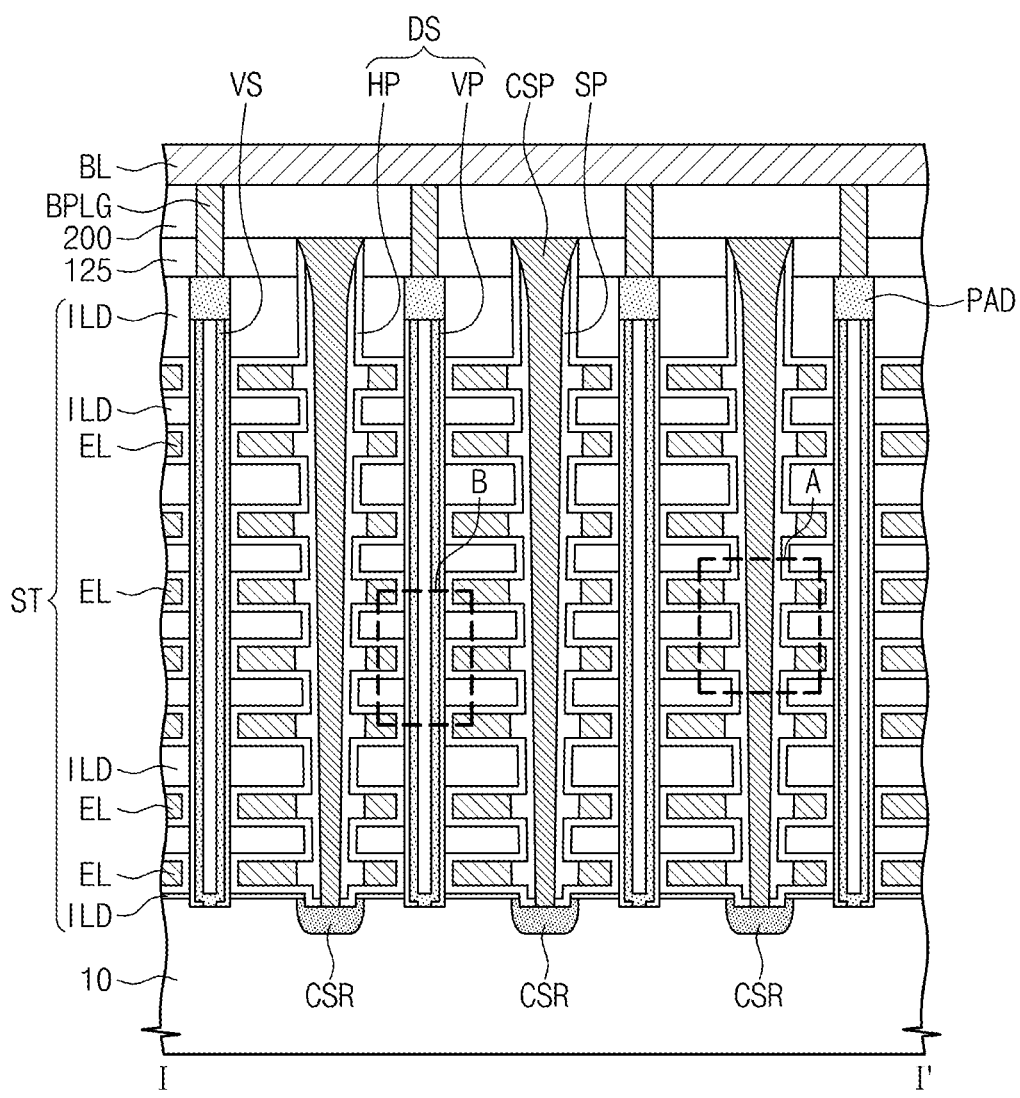

Referring to FIGS. 3 and 12, bit line contact plugs BPLG may be formed to penetrate the upper filling insulation layer 200. The bit line contact plugs BPLG may be connected to the vertical structures VS, respectively. Bit lines BL may be formed on the upper filling insulation layer 200. The bit lines BL may extend in the second direction D2 and may be connected to the bit line contact plugs BPLG. In addition, a common source line CSL may be formed together with the bit lines BL on the upper filling insulation layer 200. The common source line CSL may extend in parallel to the bit lines BL along the second direction D2 and may be disposed between the bit lines BL adjacent to each other. The common source line CSL may be electrically connected to the common source plug CSP through a common contact plug CSPLG penetrating the upper filling insulation layer 200.

FIGS. 13A to 13D, 14A to 14C, and 15 are enlarged views of a portion 'A' of FIG. 12 to illustrate methods of forming a spacer structure of a 3D semiconductor device according to example embodiments of inventive concepts. The methods of forming the spacer structure according to example embodiments of inventive concepts may be performed after the processes described with reference to FIG. 9.

The stack structures ST extending in the first direction D1 and spaced apart from each other in the second direction D2 may be formed on the substrate 10, as described with reference to FIG. 9. Each of the stack structures ST may include the electrodes EL and the insulating layers ILD alternately and repeatedly stacked on the substrate 10. In addition, the stack structures ST may have the first sidewalls S1 adjacent to the vertical structures VS and the second sidewalls S2 exposed by the trenches T, as described with reference to FIG. 9. Here, the second sidewall S2 may have the recess regions RR vertically spaced apart from each other, as illustrated in FIG. 9.

According to example embodiments, as illustrated in FIGS. 13A to 13D, forming the spacer structure SP may include forming an insulating spacer 141 covering the sidewalls of the insulating layers ILD and the electrodes EL exposed by the trench T and filling the recess regions RR, forming a protection spacer layer 143 on a surface of the insulating spacer 141, and planarizing a surface of the protection spacer layer 143 exposed by the trench T to form a protection spacer 145. A method of forming the spacer structure SP according to example embodiments will be described in more detail with reference to FIGS. 13A to 13D.

Figure 13A:
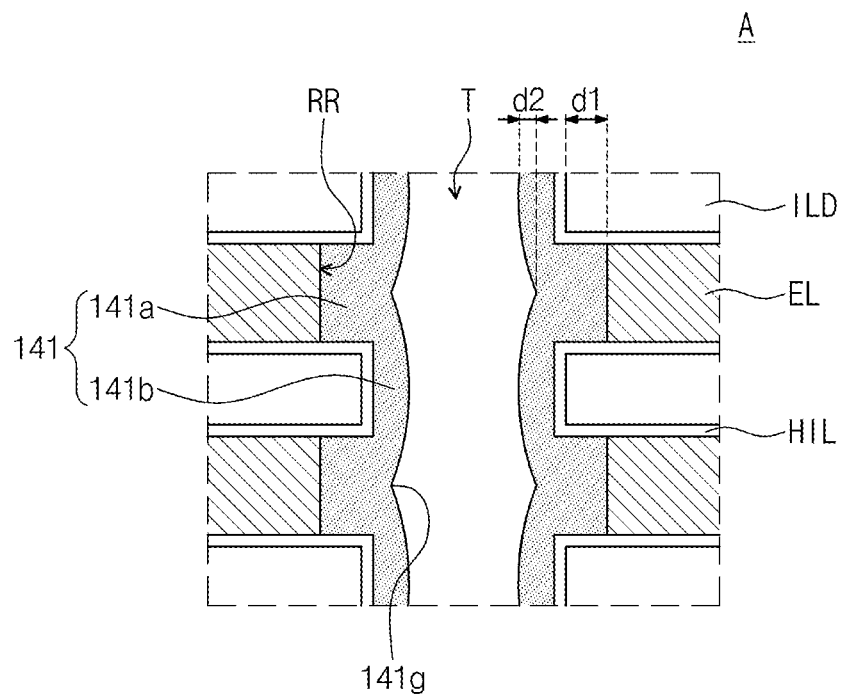
FIGS. 13A to 13D, 14A to 14C, and 15 are enlarged views of a portion 'A' of FIG. 12 to illustrate methods of forming a spacer structure of a 3D semiconductor device according to example embodiments of inventive concepts.

Referring to FIGS. 9 and 13A, forming the insulating spacer 141 may include forming an insulating layer with a substantially uniform thickness on the sidewall of the stack structure ST exposed by the trench T, and performing an anisotropic etching process on the insulating layer to form the insulating spacer 141 exposing the substrate 10. For example, the insulating spacer 141 may be formed of an insulating material such as silicon oxide, silicon nitride, silicon nitride, or a low-k dielectric material having a low dielectric constant.

In more detail, the insulating layer may be conformally deposited on the sidewalls of the insulating layers ILD and the electrodes EL exposed by the trench T. The insulating layer may be deposited using a CVD technique or ALD technique having an excellent step coverage property. The thickness of the insulating layer may be smaller than a half of the minimum width of the trench T. In addition, the insulating layer may completely fill the recess regions RR of the sidewall of the stack structure ST. Since the sidewall of the stack structure ST has the recess regions RR, grooves may be formed at a surface of the insulating layer when the insulating layer is formed using the deposition technique having the excellent step coverage property. In other words, the surface of the insulating layer, which is exposed by the trench T, may be non-flat.

The anisotropic etching process may be performed on the insulating layer after the deposition of the insulating layer, and thus the insulating layer on the top surfaces of the stack structure ST and the substrate 10 may be removed to form the insulating spacer 141. A thickness of an upper portion of the insulating spacer 141 may be progressively less toward a top end of the insulating spacer 141 adjacent to the top surface of the uppermost insulating layer ILD.

In example embodiments, the insulating spacer 141 may include concave portions 141a respectively filling the recess regions RR and convex portions 141b respectively formed on the sidewalls of the insulating layers ILD. In other words, grooves 141g may be formed at the surface of the insulating spacer 141 by the concave portions 141a and the convex portions 141b. The concave portions and convex portions 141a and 141b may also be referred to as first portions and second portions respectively.

In example embodiments, a horizontal distance d2 between a surface of the concave portion 141a and a surface of the convex portion 141b may be smaller than a lateral depth d1 of the recess region RR. The lateral depth d1 of the recess region RR may correspond to a horizontal distance between the sidewall of the insulating layer ILD and the sidewall of the electrode EL.

Figure 13B:
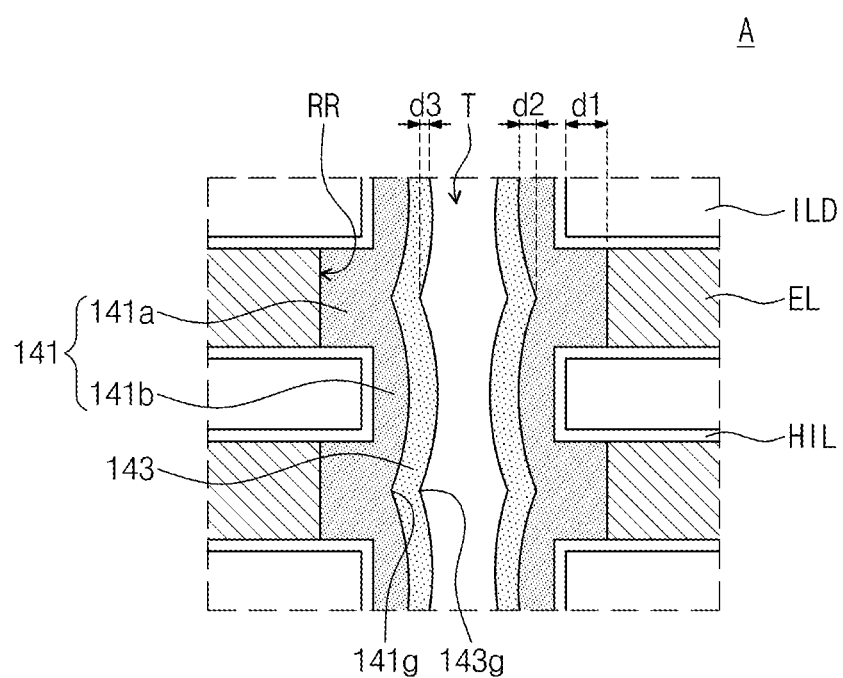

Referring to FIG. 13B, the protection spacer layer 143 having a substantially uniform thickness may be deposited on the surface of the insulating spacer 141. The protection spacer layer 143 may be deposited using a CVD or ALD technique having an excellent step coverage property. In other words, since the surface of the insulating spacer 141 has the grooves 141g, the protection spacer layer 143 may be conformally deposited along a profile of the surface of the insulating spacer 141. Thus, a surface of the protection spacer layer 143, which is exposed by the trench T, may have grooves 143g.

In example embodiments, the protection spacer layer 143 may include concave portions adjacent to the electrodes EL and convex portions adjacent to the insulating layers ILD, and the grooves 143g may be formed by the concave portions and the convex portions of the protection spacer layer 143. A horizontal distance d3 between a surface of the concave portion and a surface of the convex portion of the protection spacer layer 143 may be smaller than the horizontal distance d2 between the surface of the concave portion 141a and the surface of the convex portion 141b of the insulating spacer 141.

The protection spacer layer 143 may be formed of a different material from the insulating spacer 141 and may be formed of a material capable of limiting (and/or preventing) a reaction gas generated during the formation of the common source plug CSP from permeating into the insulating spacer 141. For example, the protection spacer layer 143 may include at least one of silicon (Si), germanium (Ge), silicon-germanium (SiGe), silicon carbide (SiC), a low-k dielectric material, or a metal material. For example, the protection spacer layer 143 may be an amorphous or polycrystalline silicon layer.

Figure 13C:
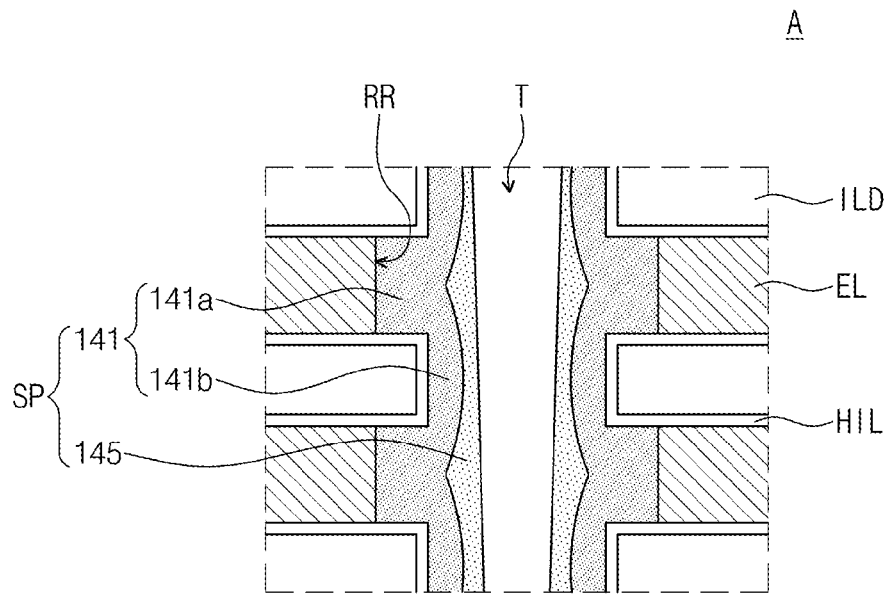

Referring to FIG. 13C, an isotropic etching process may be performed on the protection spacer layer 143 to form the protection spacer 145. During the isotropic etching process using a chemical, an area of a surface, reacting with the chemical, of the protection spacer layer 143 may be varied depending on the surface profile of the protection spacer layer 143. In other words, during the isotropic etching process of the protection spacer layer 143, an etched amount of the convex portions may be greater than that of the concave portions by a difference in surface area between the convex portions and the concave portions. The surface flatness of the protection spacer 145 may be improved. In other words, the protection spacer 145 may have a substantially flat surface exposed by the trench T.

For example, the isotropic etching process of the protection spacer layer 143 may be performed using a chemical physical etching process (e.g., a reactive ion etching (RIE) process), a wet etching process using an etchant, a chemical pyrolysis etching process (e.g., a gas-phase etching (GPE) process), or any combination thereof. In example embodiments, a standard clean 1 (SC1) solution or a gas-phase etchant including chlorine (e.g., C12) may be used during the isotropic etching process of the protection spacer layer 143.

Figure 13D:
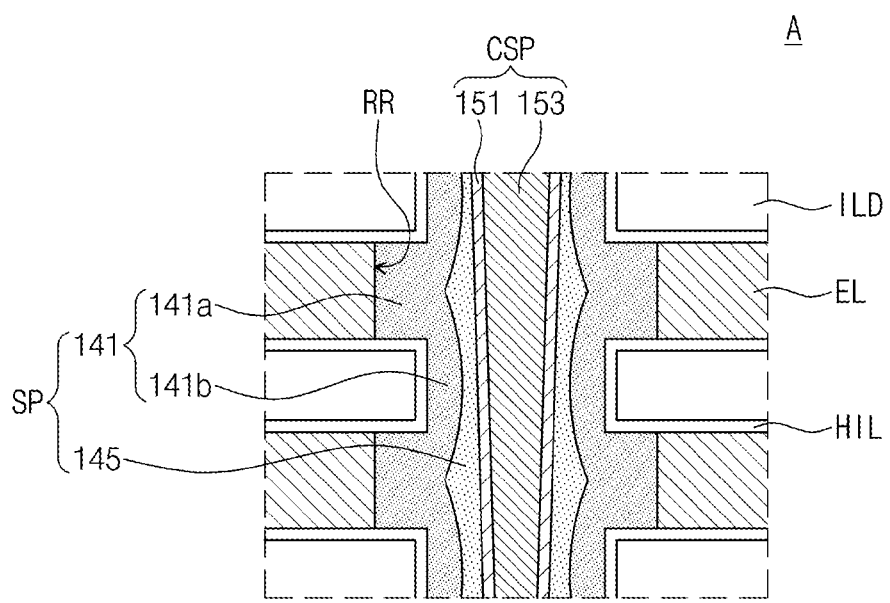

Referring to FIG. 13D, the common source plug CSP may be formed in the trench T having the spacer structures SP.

Forming the common source plug CSP may include depositing a barrier metal layer 151 covering the inner surface of the trench T, and depositing a metal layer 153 on the barrier metal layer 151.

The barrier metal layer 151 may be deposited with a substantially uniform thickness on the surface of the protection spacer 145, a portion of the top surface of the substrate 10, and the top surface of the stack structure ST. The barrier metal layer 151 may be formed of a conductive material capable of limiting (and/or preventing) a metal material filling the trench T from being diffused. For example, the barrier metal layer 151 may be formed of Ta, TaN, TaSiN, Ti, TiN, TiSiN, W, WN, or any combination thereof. The barrier metal layer 151 may be formed using a CVD technique, an ALD technique, or a physical vapor deposition (PVD) technique (e.g., a sputtering technique). In example embodiments, the barrier metal layer 151 may be formed of a titanium nitride (TiN) layer.

The metal layer 153 may fill the trench T having the barrier metal layer 151 and may also be deposited on the top surface of the stack structure ST. The metal layer 153 may be deposited using a thermal CVD technique, a plasma-enhanced CVD technique, a physical CVD technique, or an ALD technique. The metal layer 153 may be formed of a metal material such as W, Al, Ti, Ta, Co, or Cu. In example embodiments, the metal layer 153 may be a tungsten layer. The tungsten layer may be formed by a CVD technique using a tungsten hexafluoride ($WF_6$) gas and a silane ($SiH_4$) gas (or a hydrogen ($H_2$) gas).

Subsequently, a planarization process may be performed on the metal layer 153 and the barrier metal layer 151 to form the common source plug CSP in each of the trenches T.

According to example embodiments of inventive concepts, since the surface of the protection spacer 145 exposed by the trench T is substantially flat, the barrier metal layer 151 and the metal layer 153 may also be uniformly deposited on the surface of the protection spacer 145 without unevenness. Thus, the metal layer 153 may completely fill the trench T without a void or seam. As a result, it is possible to limit (and/or prevent) a reaction gas generated during the formation of the common source plug CSP from permeating into the void or seam to damage the spacer structure SP.

Figure 14A:
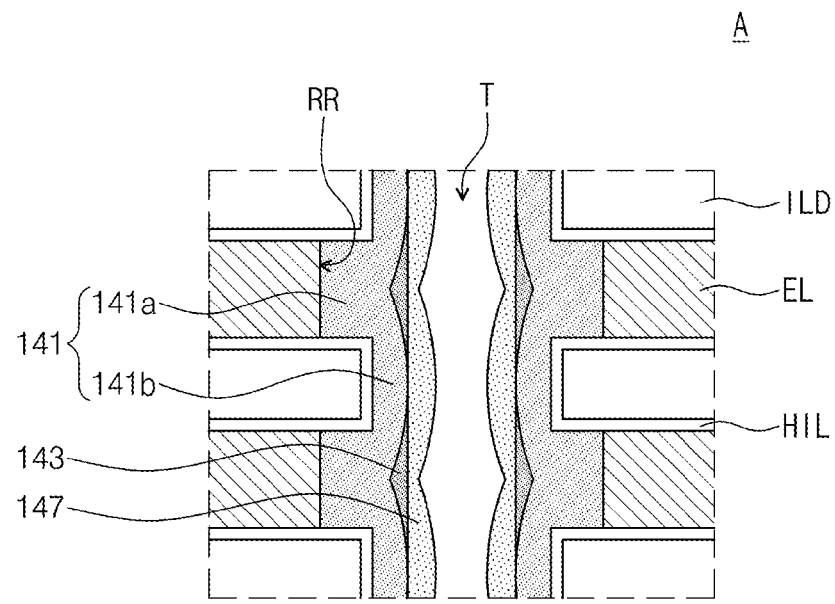
Figure 14B:
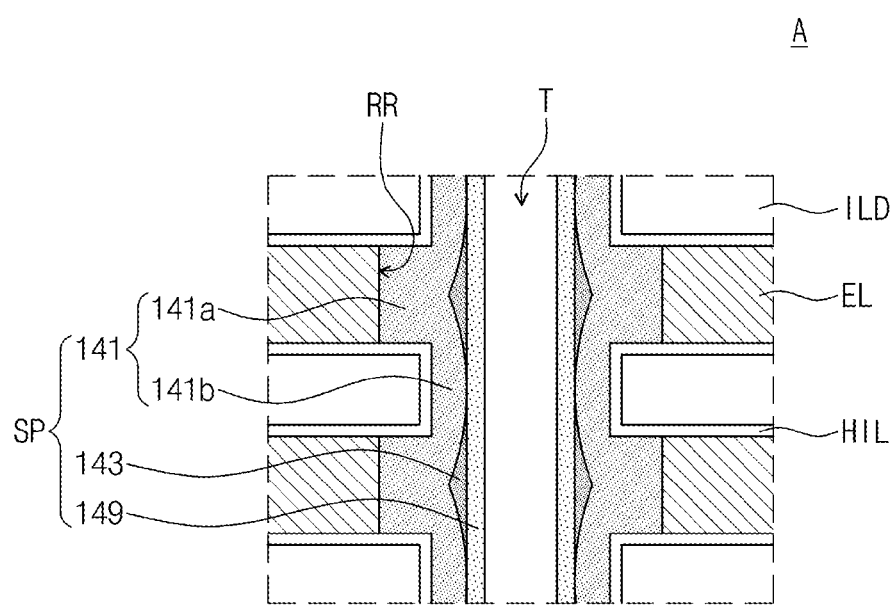
Figure 14C:
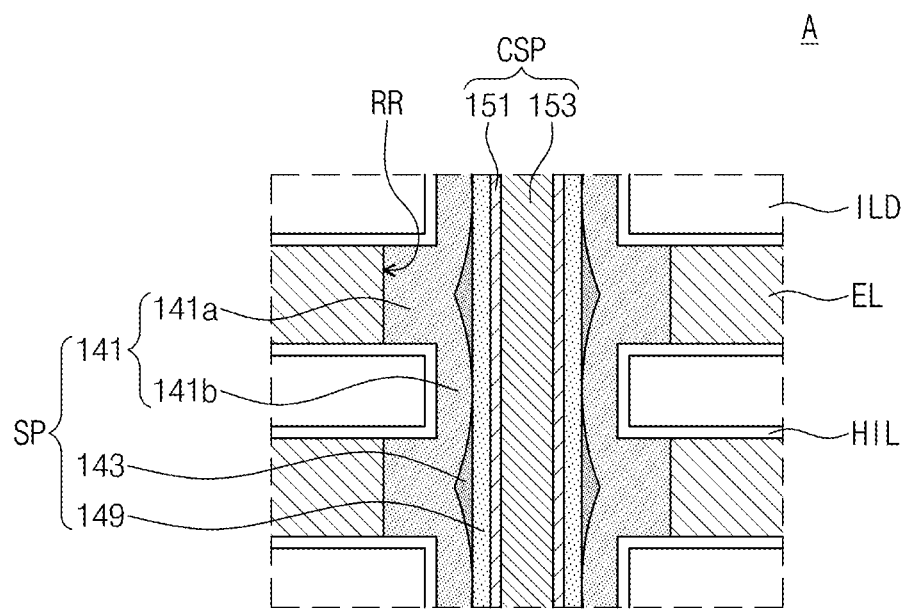

According to example embodiments illustrated in FIGS. 14A to 14C, forming the spacer structure SP may include forming an insulating spacer 141 covering the sidewalls of the insulating layers ILD and the electrodes EL exposed by the trench T and filling the recess regions RR, forming a first protection spacer layer 143 on the surface of the insulating spacer 141, and forming a second protection layer 147 on the first protection layer 143.

In detail, referring to FIG. 14A, the insulating spacer 141 completely filling the recess regions RR and having the grooves 141g may be formed on the sidewalls of the insulating layers ILD and the electrodes EL exposed by the trench T, as described with reference to FIG. 13A. In other words, the insulating spacer 141 may have the non-flat surface.

Next, the first protection spacer layer 143 may be formed on the non-flat surface of the insulating spacer 141. The first protection spacer layer 143 may be the same as the protection spacer layer 143 described with reference to FIG. 13B. In other words, the first protection spacer layer 143 may be conformally deposited along the surface profile of the insulating spacer 141. Thus, a surface of the first protection spacer layer 143 exposed by the trench T may have grooves. In detail, the first protection spacer layer 143 may include concave portions adjacent to the sidewalls of the electrodes EL and convex portions adjacent to the sidewalls of the insulating layers ILD. In example embodiments, the first protection spacer layer 143 may be an amorphous or polycrystalline silicon layer.

Subsequently, the second protection spacer layer 147 may be formed after the formation of the first protection spacer layer 143. The second protection spacer layer 147 may be formed by partially performing a thermal oxidation process on the surface of the first protection spacer layer 143. In the thermal oxidation process, an oxidized amount of the convex portion of the first protection spacer layer 143 may be greater than that of the concave portion of the first protection spacer layer 143. Thus, after the formation of the second protection spacer layer 147, a thickness of the first protection spacer layer 143 remaining between the second protection spacer layer 147 and the insulating spacer 141 may be non-uniform and the remaining first protection spacer layer 143 may fill the grooves of the insulating spacer 141. For example, the first protection spacer layer 143 may be formed locally between the insulating spacer 141 and the second protection spacer layer 147. In other words, the first protection spacer layer 143 may be formed locally between the convex portions of the insulating spacer 141.

Referring to FIG. 14B, the second protection spacer layer 147 exposed by the trench T may be etched to form a second protection spacer 149 having a substantially flat surface. The second protection spacer layer 147 may be etched by the isotropic etching process described with reference to FIG. 13C. Thus, the second protection spacer 149 may have the substantially flat surface exposed by the trench T.

Referring to FIG. 14C, the common source plug CSP may be formed using a process of sequentially depositing the barrier metal layer 151 and the metal layer 153 on the flat surface of the second protection spacer 149. In example embodiments, the barrier metal layer 151 may be in direct contact with the flat surface of the second protection spacer 149. The method of forming the common source plug CSP may be the same as described with reference to FIG. 13D, and thus the detailed descriptions thereto will be omitted.

Figure 15:
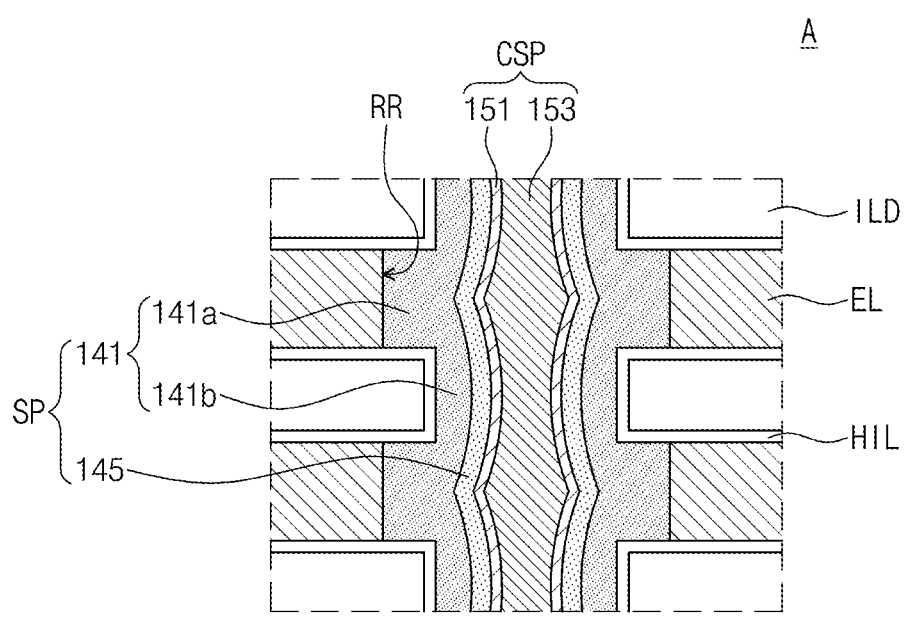

According to example embodiments illustrated in FIG. 15, forming the spacer structure SP may include forming an insulating spacer 141 covering the sidewalls of the insulating layers ILD and the electrodes EL exposed by the trench T and filling the recess regions RR, and forming a protection spacer 145 on the surface of the insulating spacer 141. Here, the method of forming the insulating spacer 141 and the protection spacer 145 may be the same as described with reference to FIGS. 13A and 13B, and thus the detailed descriptions thereto will be omitted.

Referring to FIG. 15, the barrier metal layer 151 and the metal layer 153 may be sequentially deposited on the non-flat surface of the protection spacer 145. Thus, the deposited barrier metal layer 151 may have an uneven surface. In addition, a surface of the metal layer 153, which is in contact with the barrier metal layer 151, may also be uneven. In other words, the common source plug CSP may have an uneven sidewall.

Hereinafter, various examples of the data storage layer will be described in detail with reference to FIGS. 16A to 16E.

In example embodiments, the 3D semiconductor device may be a NAND flash memory device including a 3D memory array. The 3D memory array may be monolithically formed on a substrate (e.g., semiconductor substrate such as silicon, or semiconductor-on-insulator substrate). The 3D memory array may include two or more physical levels of memory cells having an active area disposed above the substrate and circuitry associated with the operation of those memory cells, whether such associated circuitry is above or within such substrate. The layers of each level of the array may be directly deposited on the layers of each underlying level of the array.

In example embodiments, the 3D memory array may include vertical NAND strings that are vertically oriented such that at least one memory cell is located over another memory cell. The at least one memory cell may comprise a charge trap layer.

The following patent documents, which are hereby incorporated by reference in their entirety, describe suitable configurations for three-dimensional memory arrays, in which the three-dimensional memory array is configured as a plurality of levels, with word lines and/or bit lines shared between levels: U.S. Pat. Nos. 7,679,133; 8,553,466; 8,654, 587; 8,559,235; and US Pat. Pub. No. 2011/0233648.

For example, the data storage layer DS between the stack structure ST and the vertical structure VS may include a tunnel insulating layer TIL, a charge storage layer CIL, and a blocking insulating layer BK. Data stored in the data storage layer DS may be changed using Flower-Nordheim tunneling caused by a voltage difference between the electrode EL and the vertical structure VS including the semiconductor material. A vertical insulating layer VI (e.g., silicon oxide) may fill an opening in the vertical structure VS.

Figure 16A:
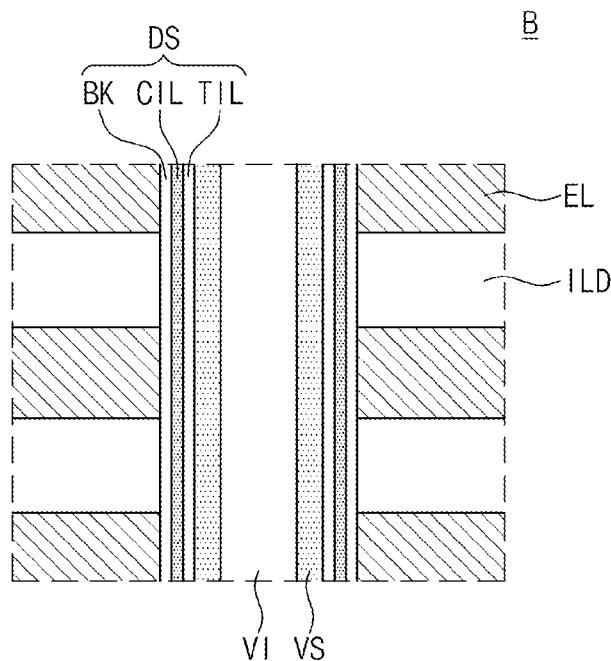
FIGS. 16A to 16E are enlarged views of a portion 'B' of FIG. 12 to illustrate embodiments of a data storage layer of a 3D semiconductor device according to example embodiments of inventive concepts.

Referring to FIG. 16A, the tunnel insulating layer TIL, the charge storage layer CIL, and the blocking insulating layer BK may extend from between the electrode EL and the vertical structure VS into between the insulating layer ILD and the vertical structure VS. In other words, the insulating layer ILD may be in direct contact with the electrode EL. In this case, the horizontal insulating pattern HP of FIG. 12 may be omitted.

Figure 16B:
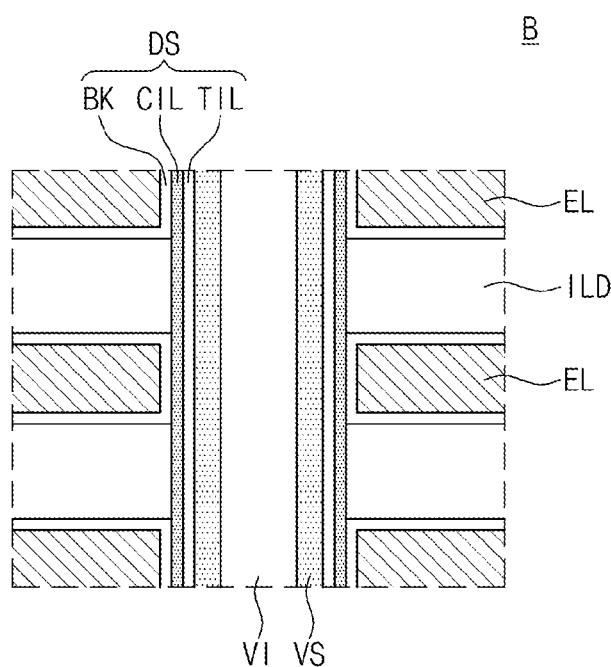

Referring to FIG. 16B, the tunnel insulating layer TIL and the charge storage layer CIL may extend from between the electrode EL and the vertical structure VS into between the insulating layer ILD and the vertical structure VS. The blocking insulating layer BK may extend from between the electrode EL and the vertical structure VS onto top and bottom surfaces of the electrode EL.

Figure 16C:
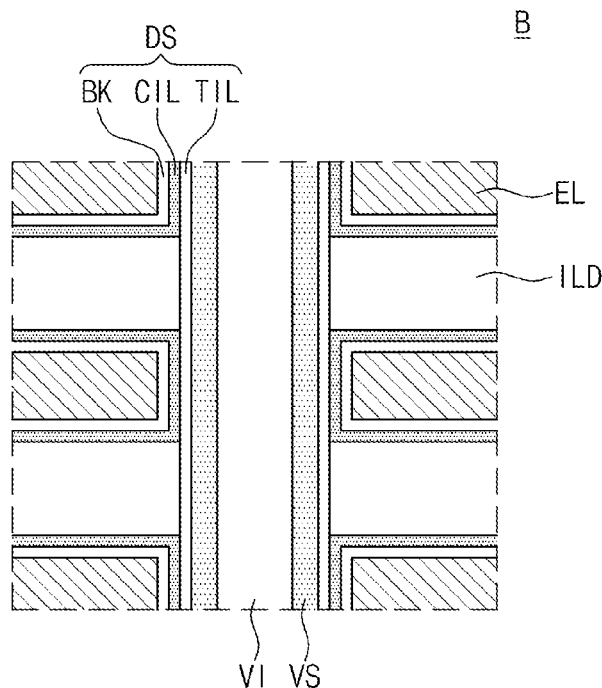

Referring to FIG. 16C, the tunnel insulating layer TIL may extend from between the electrode EL and the vertical structure VS into between the insulating layer ILD and the vertical structure VS. The charge storage layer CIL and the blocking insulating layer BK may extend from between the electrode EL and the vertical structure VS onto the top and bottom surfaces of the electrode EL.

Figure 16D:
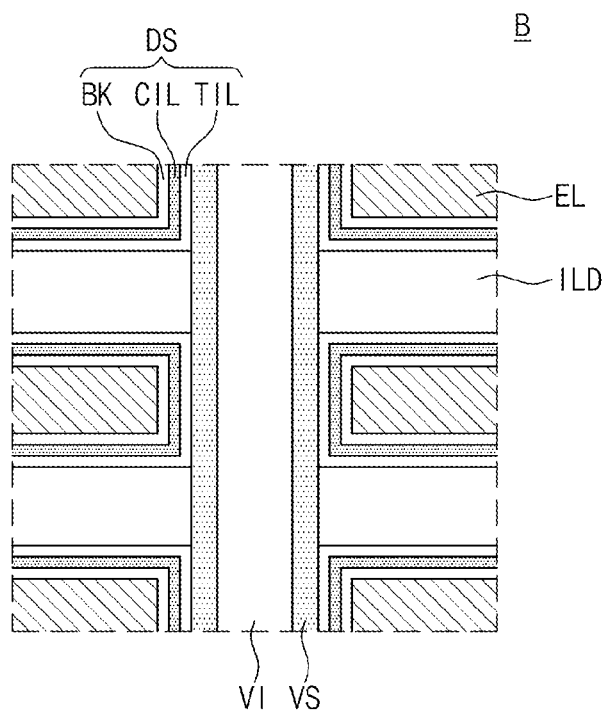

Referring to FIG. 16D, the tunnel insulating layer TIL, the charge storage layer CIL, and the blocking insulating layer BK may extend from between the electrode EL and the vertical structure VS onto the top and bottom surfaces of the electrode EL.

Figure 16E:
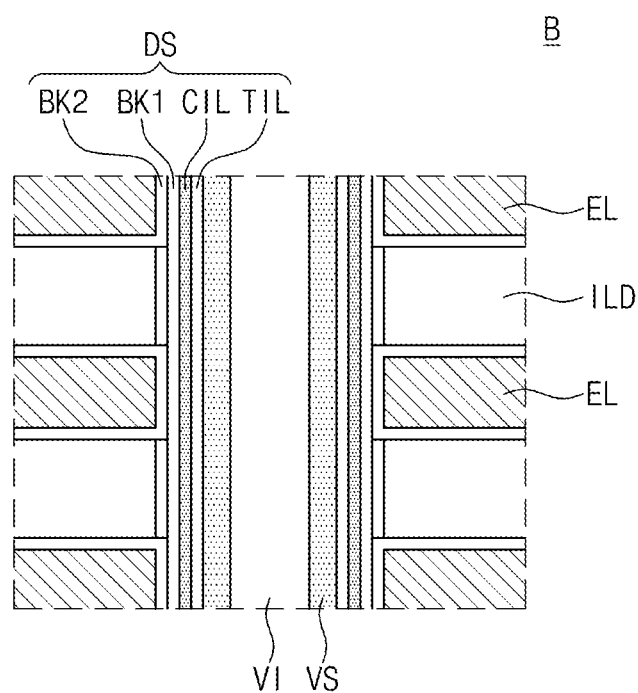

Referring to FIG. 16E, the data storage layer DS may include first and second blocking insulating layers BK1 and BK2 which are formed of materials different from each other. The tunnel insulating layer TIL, the charge storage layer CIL, and the first blocking insulating layer BK1 may extend from between the electrode EL and the vertical structure VS into between the insulating layer ILD and the vertical structure VS. The second blocking insulating layer BK2 may extend from between the electrode EL and the first blocking insulating layer BK1 onto the top and bottom surfaces of the electrode EL.

In the data storage layers DS illustrated in FIGS. 16A to 16E, the charge storage layer CIL may include at least one of a trap site-rich insulating layer, a floating gate electrode, or an insulating layer including conductive nano dots (or nano particles). The charge storage layer CIL may be formed using a CVD technique and/or an ALD technique. In example embodiments, the charge storage layer CIL may include at least one of, but not limited to, a silicon nitride layer, a silicon oxynitride layer, a silicon-rich nitride layer, a nano-crystalline silicon layer, or a laminated trap layer.

The tunnel insulating layer TIL may include at least one of materials having energy band gaps greater than that of the charge storage layer CIL and may be formed using a CVD technique and/or an ALD technique. For example, the tunnel insulating layer TIL may include a silicon oxide layer formed using the CVD technique or the ALD technique. Alternatively, the tunnel insulating layer TIL may include one of high-k dielectric layers such as an aluminum oxide layer and a hafnium oxide layer.

The blocking insulating layer BK may include at least one of materials having of which energy band gaps are smaller than that of the tunnel insulating layer TIL and greater than that of the charge storage layer CIL. For example, the blocking insulating layer BK may include at least one of high-k dielectric layers such as an aluminum oxide layer and a hafnium oxide layer. The blocking insulating layer BK may be formed using at least one of a CVD technique or an ALD technique.

As illustrated in FIG. 16E, in the case in which the data storage layer DS includes the first and second blocking insulating layers BK1 and BK2, the first blocking insulating layer BK1 may include at least one of the high-k dielectric layers such as an aluminum oxide layer and a hafnium oxide layer, and the second blocking insulating layer BK2 may include a material having a lower dielectric constant than the first blocking insulating layer BK1. Alternatively, the second blocking insulating layer BK2 may include at least one of the high-k dielectric layers, and the first blocking insulating layer BK1 may include a material having a lower dielectric constant than the second blocking insulating layer BK2.

Data stored in the data storage layers DS of FIGS. 16A to 16E may be changed using the Flower-Nordheim tunneling caused by the voltage difference between the electrode EL and the vertical structure VS, as described above. Alternatively, the data storage layer DS may include a thin layer capable of storing data based on another operation principle. For example, the data storage layer DS may include a thin layer for a phase-change memory cell or a thin layer for a variable resistance memory cell.

Figure 17:
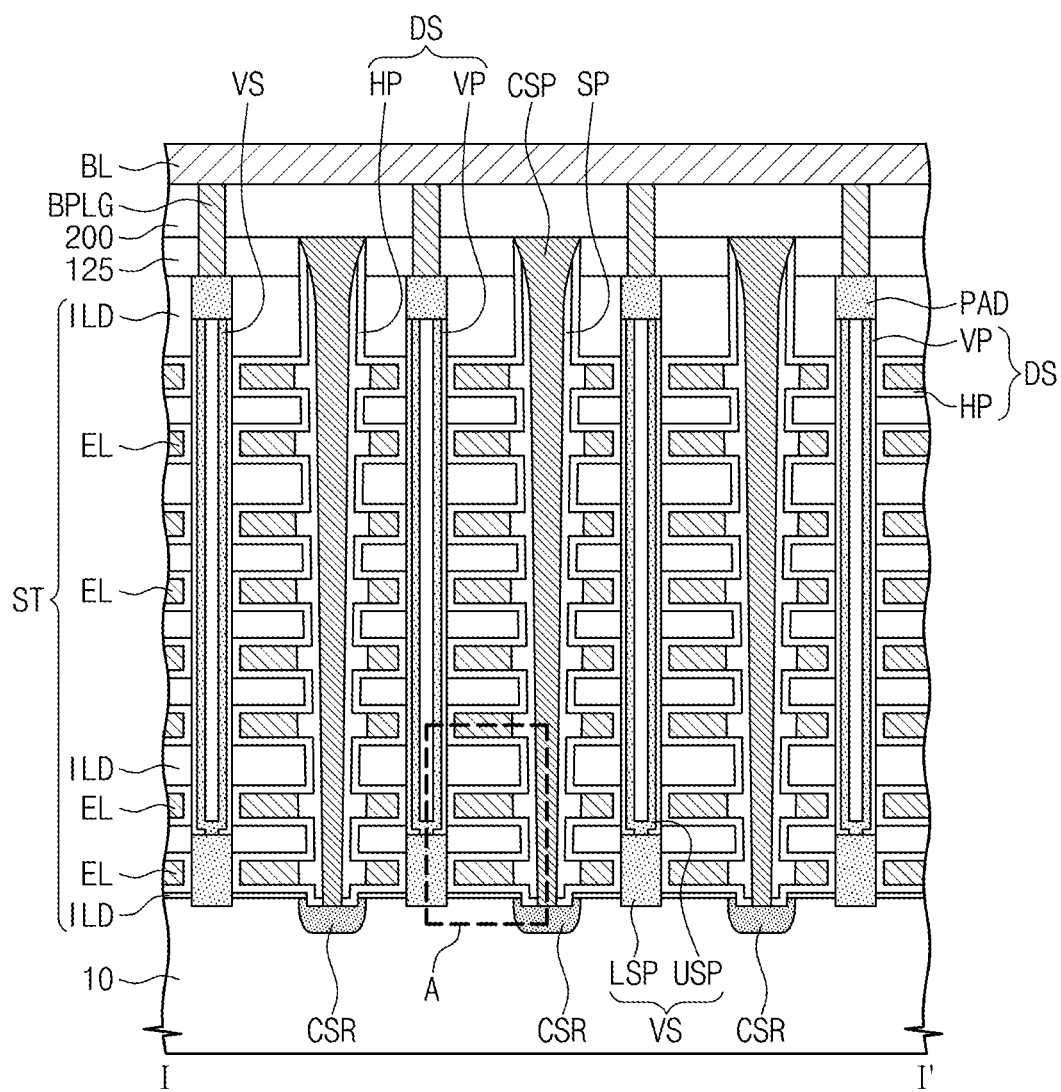
FIG. 17 is a cross-sectional view taken along the line I-I' of FIG. 3 to illustrate a 3D semiconductor device according to example embodiments of inventive concepts.
Figure 18:
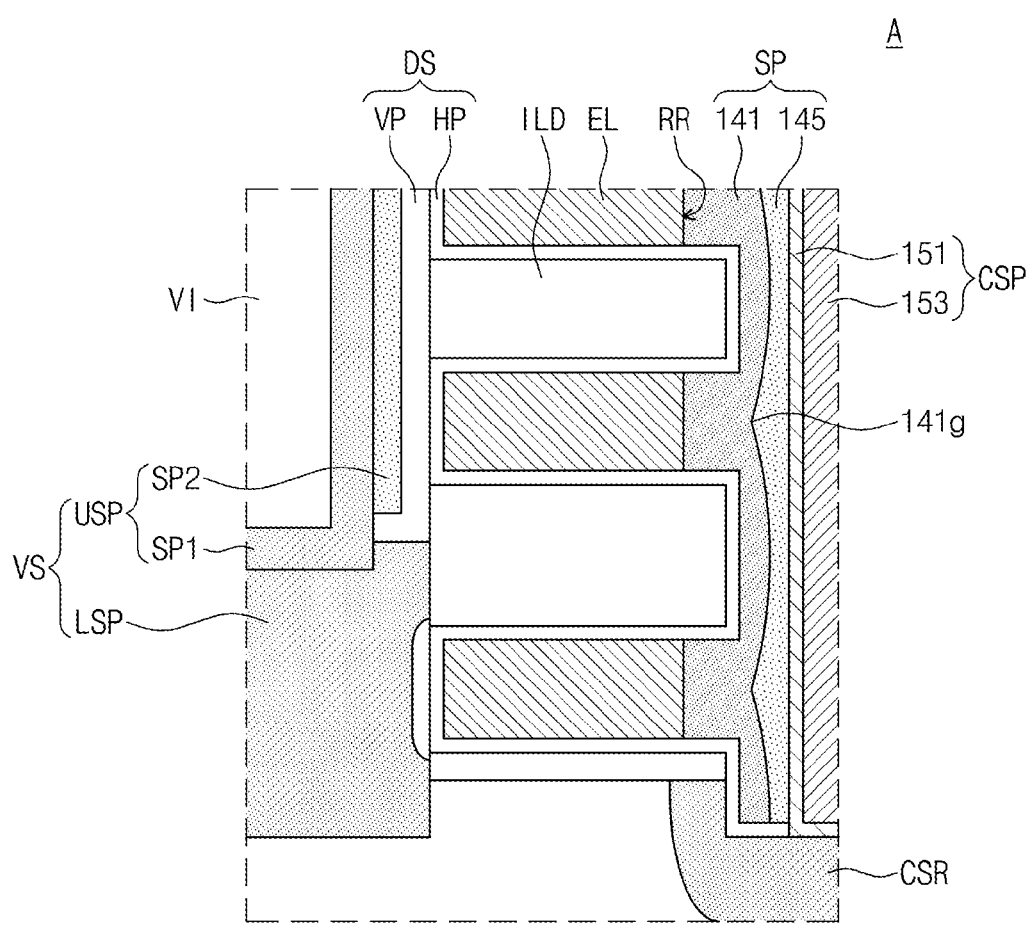
FIG. 18 is an enlarged view of a portion 'A' of FIG. 17.

FIG. 17 is a cross-sectional view taken along the line I-I' of FIG. 3 to illustrate a 3D semiconductor device according to example embodiments of inventive concepts. FIG. 18 is an enlarged view of a portion 'A' of FIG. 17. Hereinafter, the descriptions to the same technical features as example embodiments described in FIGS. 4 to 12 will be omitted or mentioned briefly for the purpose of ease and convenience in explanation.

Referring to FIGS. 17 and 18, each of vertical structures VS may include a lower semiconductor pattern LSP penetrating a lower portion of the stack structure ST so as to be connected to the substrate 10, and an upper semiconductor pattern USP penetrating an upper portion of the stack structure ST so as to be connected to the lower semiconductor pattern LSP.

The upper semiconductor pattern USP may have a hollow pipe or macaronic shape. At this time, a bottom end of the upper semiconductor pattern USP may be in a closed state. An inner space of the upper semiconductor pattern USP may be filled with a filling insulation pattern VI. A bottom surface of the upper semiconductor pattern USP may be disposed at a lower level than a top surface of the lower semiconductor pattern LSP. In other words, a bottom end portion of the upper semiconductor pattern USP may be inserted in a recessed region formed in a portion of the top surface of the lower semiconductor pattern LSP. The upper semiconductor pattern USP may be formed of a semiconductor material. For example, the upper semiconductor pattern USP may include silicon (Si), germanium (Ge), or a combination thereof. The upper semiconductor pattern USP may be doped with dopants or may be undoped or in an intrinsic state. The upper semiconductor pattern USP may have a crystal structure including at least one of a single-crystalline structure, an amorphous structure, or a poly-crystalline structure. The upper semiconductor pattern USP may include a conductive pad PAD disposed at its top end. The conductive pad PAD may be a dopant region doped with dopants or may be formed of a conductive material.

In more detail, as illustrated in FIG. 18, the upper semiconductor pattern USP may include a first semiconductor pattern SP1 and a second semiconductor pattern SP2. The first semiconductor pattern SP1 may be connected to the lower semiconductor pattern LSP and may have a hollow pipe or macaronic shape having a closed bottom end. The inner space of the first semiconductor pattern SP1 may be filled with the filling insulation pattern VI. The first semiconductor pattern SP1 may be in contact with an inner sidewall of the second semiconductor pattern SP2 and the top surface of the lower semiconductor pattern LSP. In other words, the first semiconductor pattern SP1 may electrically connect the second semiconductor pattern SP2 to the lower semiconductor pattern LSP. The second semiconductor pattern SP2 may cover the inner sidewall of the stack structure ST. The second semiconductor pattern SP2 may have a pipe or macaroni shape of which top and bottom ends are opened. The second semiconductor pattern SP2 may be spaced apart from the lower semiconductor pattern LSP. The first and second semiconductor patterns SP1 and SP2 may be undoped or may be doped with dopants of the same conductivity type as the substrate 10. The first and second semiconductor patterns SP1 and SP2 may be in a poly-crystalline state or single-crystalline state.

The lower semiconductor pattern LSP may be used as a channel region of the ground selection transistor GST described with reference to FIG. 2. The lower semiconductor pattern LSP may be formed of a semiconductor material having the same conductivity type as the substrate 10. In example embodiments, the lower semiconductor pattern LSP may be an epitaxial pattern formed using an epitaxial or laser crystallization technique using the substrate 10 as a seed. In this case, the lower semiconductor pattern LSP may have a single-crystalline structure or a poly-crystalline structure having a greater grain size than a semiconductor material formed by a CVD technique. In example embodiments, the lower semiconductor pattern LSP may be formed of a poly-crystalline semiconductor material (e.g., poly-silicon). In example embodiments, the insulating layer ILD adjacent to the lower semiconductor pattern LSP may be in direct contact with a sidewall of the lower semiconductor pattern LSP.

In example embodiments, the lower semiconductor pattern LSP may have a pillar shape penetrating the lowermost electrode EL. A bottom surface of the lower semiconductor pattern LSP may be disposed at a lower level than the top surface of the substrate 10. The top surface of the lower semiconductor pattern LSP may be higher than a top surface of the lowermost electrode EL.

The data storage layer DS may be disposed between the stack structure ST and the vertical structure VS. The data storage layer DS may include the vertical insulating pattern VP penetrating the stack structure ST and the horizontal insulating pattern HP extending from between the vertical insulating pattern VP and the electrode EL onto the top and bottom surfaces of the electrode EL. In example embodiments, the vertical insulating pattern VP of the data storage layer DS may surround the sidewall of the upper semiconductor pattern USP and may be disposed on the lower semiconductor pattern LSP.

The common source plug CSP connected to the common source region CSR may be disposed between the stack structures ST adjacent to each other. The common source plug CSP may extend in parallel to the stack structures ST. The common source plug CSP may include the barrier metal layer 151 and the metal layer 153.

The spacer structure SP may be disposed between the common source plug CSP and the sidewall of the stack structure ST. The spacer structure SP may include the insulating spacer 141 filling the recess regions RR defined by the sidewall of the stack structure ST and the protection spacer 145. The surface of the insulating spacer 141 may include the grooves 141g, and the protection spacer 145 may fill the grooves 141g of the insulating spacer 141. In example embodiments, the protection spacer 145 may have the substantially flat surface which is in contact with the common source plug CSP. Meanwhile, the protection spacer 145 may include the first and second protection spacers described with reference to FIG. 14C.

Figure 19:
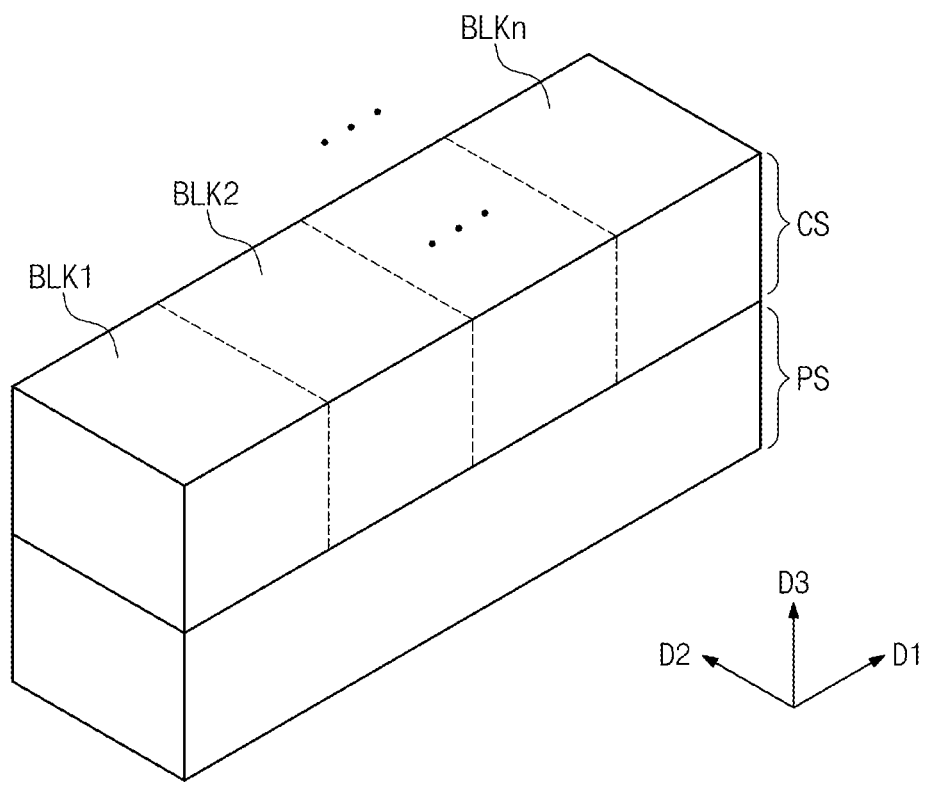
FIG. 19 is a schematic block diagram illustrating a 3D semiconductor device according to example embodiments of inventive concepts.

FIG. 19 is a schematic block diagram illustrating a 3D semiconductor device according to example embodiments of inventive concepts.

Referring to FIG. 19, a 3D semiconductor device according to example embodiments may include a peripheral logic structure PS and a cell array structure CS stacked on the peripheral logic structure PS. In other words, the peripheral logic structure PS and the cell array structure CS may overlap with each other when viewed from a plan view.

In example embodiments, the peripheral logic structure PS may include the row and column decoders 2 and 4, the page buffer 3, and the control circuit 5, which are described with reference to FIG. 1. The cell array structure CS may include a plurality of memory blocks BLK0 to BLKn of which each corresponds to a data erase unit. Each of the memory blocks BLK0 to BLKn may include a structure that is stacked on a plane, defined by first and second directions D1 and D2, along a third direction D3. Each of the memory blocks BLK0 to BLKn may include a memory cell array having a three-dimensional structure (or a vertical structure). The memory cell array may include the three-dimensionally arranged memory cells, the word lines, and the bit lines, which are described with reference to FIG. 2.

Figure 20:
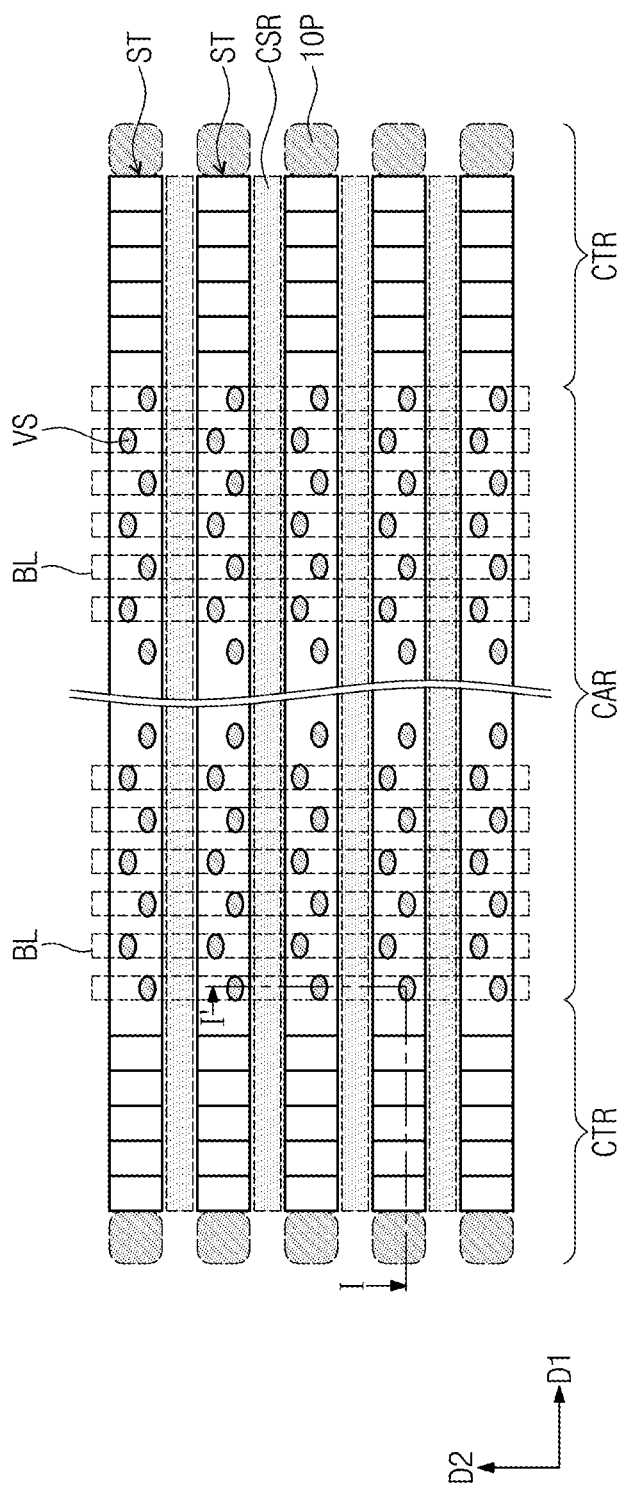
FIG. 20 is a plan view illustrating a 3D semiconductor device according to example embodiments of inventive concepts.
Figure 21:
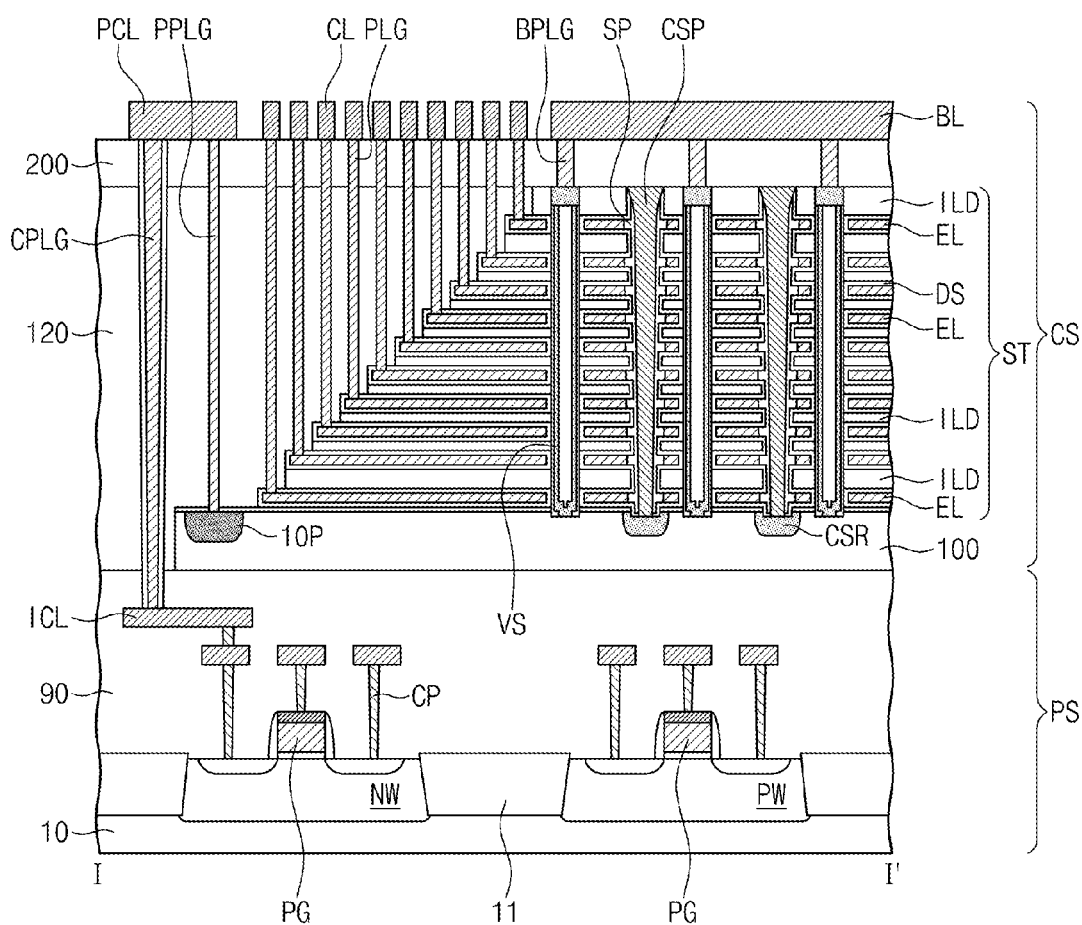
FIG. 21 is a cross-sectional view taken along a line I-I' of FIG. 20 to illustrate a 3D semiconductor device according to example embodiments of inventive concepts.

FIG. 20 is a plan view illustrating a 3D semiconductor device according to example embodiments of inventive concepts. FIG. 21 is a cross-sectional view taken along a line I-I' of FIG. 20 to illustrate a 3D semiconductor device according to example embodiments of inventive concepts.

Referring to FIGS. 20 and 21, Referring to FIG. 18, a peripheral logic structure PS and a cell array structure CS may be sequentially stacked on a substrate 10. In other words, the peripheral logic structure PS may be disposed between the substrate 10 and the cell array structure CS when viewed from a cross-sectional view. That is, the peripheral logic structure PS may overlap with the cell array structure CS when viewed from a plan view.

The substrate 10 may be a bulk silicon substrate, a silicon-on-insulator (SOI) substrate, a germanium substrate, a germanium-on-insulator (GOI) substrate, a silicon-germanium substrate, or a substrate including an epitaxial layer obtained by performing a selective epitaxial growth (SEG) process.

The peripheral logic structure PS may include peripheral circuits including the row and column decoders 2 and 4 of FIG. 1, the page buffer 3 of FIG. 1, and the control circuit 5 of FIG. 1. In other words, the peripheral logic structure PS may include NMOS and PMOS transistors, a resistor, and a capacitor, which constitute the peripheral circuits and are electrically connected to the cell array structure CS. These peripheral circuits may be formed on an entire top surface of the substrate 10. The substrate 10 may include an N-well region NW doped with N-type dopants and a P-well region PW doped with P-type dopants. Active regions may be defined in the N-well region NW and the P-well region PW by a device isolation layer 11.

The peripheral logic structure PS may include peripheral gate electrodes PG, source and drain dopant regions disposed in the active region at both sides of each of the peripheral gate electrodes PG, peripheral contact plugs CP, peripheral circuit interconnections ICL, and a lower filling insulation layer 90 covering the peripheral circuits. The PMOS transistor may be formed on the N-well region NW, and the NMOS transistor may be formed on the P-well region PW. The peripheral circuit interconnections ICL may be electrically connected to the peripheral circuits through the peripheral contact plugs CP. In example embodiments, the peripheral contact plugs CP and the peripheral circuit interconnections ICL may be connected to the NMOS and PMOS transistors.

The lower filling insulation layer 90 may cover the peripheral circuits, the peripheral contact plugs CP, and the peripheral circuit interconnections ICL. The lower filling insulation layer 90 may include a plurality of stacked insulating layers.

The cell array structure CS disposed on the lower filling insulation layer 90 may be similar to the 3D semiconductor device manufactured by the manufacturing method described with reference to FIGS. 4 to 12. Thus, the descriptions to the same technical features as in the embodiments of FIGS. 4 to 12 will be omitted or mentioned briefly for the purpose of ease and convenience in explanation.

The cell array structure CS may be disposed on the lower filling insulation layer 90 and may include a horizontal semiconductor layer 100, stack structures ST, and vertical structures VS.

The horizontal semiconductor layer 100 may be formed on a top surface of the lower filling insulation layer 90 covering the peripheral circuits. In other words, a bottom surface of the horizontal semiconductor layer 100 may be in contact with the lower filling insulation layer 90. The horizontal semiconductor layer 100 may include a cell array region CAR and a contact region CTR adjacent to the cell array region CAR.

The horizontal semiconductor layer 100 may be formed of a semiconductor material. For example, the horizontal semiconductor layer 100 may include at least one of silicon (Si), germanium (Ge), silicon-germanium (SiGe), gallium-arsenic (GaAs), indium-gallium-arsenic (InGaAs), aluminum-gallium-arsenic (AlGaAs), or any combination thereof. The horizontal semiconductor layer 100 may be doped with dopants of a first conductivity type and/or may be undoped or in an intrinsic state. The horizontal semiconductor layer 100 may have a crystal structure including at least one of a single-crystalline structure, an amorphous structure, or a poly-crystalline structure.

The stack structures ST may extend in a first direction in parallel to each other on the horizontal semiconductor layer 100 and may be arranged along a second direction D2. The stack structures ST may be spaced apart from each other. Each of the stack structures ST may include electrodes EL vertically stacked on the horizontal semiconductor layer 100 and insulating layers ILD disposed between the electrodes EL. In the stack structure ST, thicknesses of the insulating layers ILD may be changed according to characteristics of the 3D semiconductor device. For example, the lowermost insulating layer ILD may be thinner than other insulating layers ILD. In example embodiments, one or some of the insulating layers ILD may be thicker than another or others of the insulating layers ILD. In example embodiments, the insulating layers ILD of the stack structures ST may be formed of a low-k dielectric material of which a dielectric constant is lower than that of an oxide layer. In example embodiments, at least one of the insulating layers ILD may include a low-k dielectric material having pores.

To electrically connect the electrodes EL to the peripheral logic structure PS, each of the stack structures ST may have a stepwise structure in the contact region CTR. An upper filling insulation layer 120 may be disposed on the horizontal semiconductor layer 100 to cover end portions of the electrodes EL constituting the stepwise structure. In addition, a capping insulating layer 200 may cover the plurality of stack structures ST and the upper filling insulation layer 120. Bit lines BL extending in the second direction D2 may be disposed on the capping insulating layer 200 to intersect the stack structures ST. The bit lines BL may be electrically connected to the vertical structures VS through bit line contact plugs BPLG.

The vertical structures VS may penetrate each of the stack structures ST so as to be electrically connected to the horizontal semiconductor layer 100. The vertical structures VS may include a semiconductor material. Bottom surfaces of the vertical structures VS may be disposed at a level between the top surface and the bottom surface of the horizontal semiconductor layer 100. Contact pads may be disposed on top ends of the vertical structures VS so as to be connected to the bit line contact plugs BPLG.

The data storage layer DS may be disposed between the stack structure ST and the vertical structure VS. The data storage layer DS may include the vertical insulating pattern VP penetrating the stack structure ST and the horizontal insulating pattern HP extending from between the electrode EL and the vertical insulating pattern VP onto the top and bottom surfaces of the electrode EL.

Each of common source regions CSR may be disposed in the horizontal semiconductor layer 110 between the stack structures ST adjacent to each other. The common source regions CSR may extend in parallel to the stack structures ST along the first direction D1. Dopants of a second conductivity type may be injected into the horizontal semiconductor layer 110 to form the common source regions CSR. For example, the common source regions CSR may be doped with N-type dopants (e.g., arsenic (As) or phosphorus (P)).

The common source plug CSP may be connected to each of the common source regions CSR. The spacer structure SP may be disposed between the common source plug CSP and the stack structure ST. In example embodiments, the common source plug CSP may extend in the first direction D1, and the spacer structure SP may also extend in the first direction D1 between the common source plug CSP and the stack structure ST.

Pickup regions 10P may be formed in the horizontal semiconductor layer 100 adjacent to the stack structures ST in the contact region CTR. The pickup regions 10P may be disposed adjacently to both ends of each of the stack structures ST. In other words, the pickup regions 10P may be spaced apart from each other in the first direction D1. The pickup regions 10P may be doped with dopants of the first conductivity type. In other words, the pickup regions 10P may have the same conductivity type as the horizontal semiconductor layer 100. A dopant concentration of the pickup regions 10P may be higher than that of the horizontal semiconductor layer 100.

An interconnection structure for electrically connecting the cell array structure CS to the peripheral logic structure PS may be disposed on the stepwise structures of the stack structures ST. The upper filling insulation layer 120 may cover the stepwise structures of the stack structures ST as described above. The interconnection structure may include contact plugs PLG penetrating the upper filling insulation layer 120 so as to be connected to the end portions of the electrodes EL, and connection lines CL disposed on the upper filling insulation layer 120 so as to be connected to the contact plugs PLG. Vertical lengths of the contact plugs PLG may be reduced stepwise as a distance from the cell array region CAR decreases.

Pickup contact plugs PPLG may penetrate the upper filling insulation layer 120 so as to be connected to the pickup regions 10P. Top surfaces of the pickup contact plugs PPLG may be substantially coplanar with top surfaces of the contact plugs PLG. The pickup contact plug PPLG may be electrically connected to the peripheral logic structure PS through a well conductive line PCL and a connection plug CPLG.

The connection plug CPLG may electrically connect the cell array structure CS to the peripheral logic structure PS. The connection plug CPLG may penetrate the upper filling insulation layer 120 and the horizontal semiconductor layer 100 so as to be connected to the peripheral circuit interconnection ICL.

According to example embodiments of inventive concepts, the spacer structure may cover the sidewall of the stack structure, and the surface of the spacer structure exposed by the trench may be substantially flat. Thus, it is possible to limit (and/or prevent) a void or seam from being formed in the common source plug when the common source plug is formed in the trench having the spacer structure. As a result, it is possible to limit (and/or prevent) the reaction gas generated during the formation of the common source plug from permeating from the seam or void into the spacer structure to damage the spacer structure.

It should be understood that example embodiments described herein should be considered in a descriptive sense only and not for purposes of limitation. Descriptions of features or aspects within each device or method according to example embodiments should typically be considered as available for other similar features or aspects in other devices or methods according to example embodiments. While some example embodiments have been particularly shown and described, it will be understood by one of ordinary skill in the art that variations in form and detail may be made therein without departing from the spirit and scope of the claims.

What is claimed is:

1. A three-dimensional (3D) semiconductor device comprising:
   a plurality of stack structures extending in one direction on a substrate, the stack structures spaced apart from each other, and each of the stack structures having a sidewall defining recess regions vertically spaced apart from each other;
   a plurality of vertical structures penetrating the stack structures;
   a common source plug between the stack structures that are adjacent to each other, the common source plug extending in parallel to the stack structures; and a spacer structure at each side of the common source plug between the common source plug and the stack structures, the spacer structure covering the sidewalls of the stack structures, the spacer structure including an insulating spacer and a protection spacer, the insulating spacer filling the recess regions of the sidewalls of the stack structures, a surface of the insulating spacer defining grooves, the protection spacer filling the grooves of the surface of the insulating spacer, and the protection spacer having a substantially flat surface.

2. The 3D semiconductor device of claim 1, wherein the substantially flat surface of the protection spacer is in contact with the common source plug.

3. The 3D semiconductor device of claim 1, wherein the common source plug includes:

a metal layer between the stack structures that are adjacent to each other; and a barrier metal layer conformally covering a bottom surface and sidewalls of the metal layer, and the barrier metal layer is in contact with the substantially flat surface of the protection spacer.

4. The 3D semiconductor device of claim 1, wherein each of the stack structures includes:

insulating layers and electrodes alternately and vertically stacked on the substrate, wherein sidewalls of the electrodes are laterally recessed from sidewalls of the insulating layers to define the recess regions, the insulating spacer includes first portions adjacent to the electrodes and second portions adjacent to the insulating layers, and a horizontal distance between a surface of the first portions and a surface of the second portions is smaller than a horizontal distance between the sidewall of the insulating layer adjacent to the insulating spacer and the sidewall of the electrode adjacent to the insulating spacer.

5. The 3D semiconductor device of claim 1, wherein the insulating spacer is formed of silicon oxide, and the protection spacer is formed of one of silicon, germanium, and silicon-germanium.

6. The 3D semiconductor device of claim 1, wherein the protection spacer includes:

a first protection spacer filling the grooves of the insulating spacer; and a second protection spacer between the first protection spacer and the common source plug and having the substantially flat surface.

7. The 3D semiconductor device of claim 6, wherein the first protection spacer is formed of silicon, and the second protection spacer is formed of silicon oxide.

8. The 3D semiconductor device of claim 1, further comprising:

a data storage layer between the vertical structures and the stack structures, wherein each of the stack structures includes insulating layers and electrodes alternately and vertically stacked on the substrate, the data storage layer includes a vertical insulating pattern and horizontal pattern, the vertical insulating pattern penetrates the stack structures to surround the vertical structures, and the horizontal insulating pattern laterally extends between the vertical insulating pattern and each of the electrodes into between the each of the electrodes and the insulating layers.

9. The 3D semiconductor device of claim 8, wherein the horizontal insulating patterns further extends into between the spacer structure and the insulating layers.

10. The 3D semiconductor device of claim 1, further comprising:

a common source region formed in the substrate between the stack structures adjacent to each other, wherein the common source plug is in contact with the common source region.

11. A three-dimensional (3D) semiconductor device comprising:

a plurality of stack structures extending in one direction on a substrate, the stack structures spaced apart from each other, and each of the stack structures having a sidewall defining recess regions vertically spaced apart from each other;

a plurality of vertical structures penetrating the stack structures;

a common source plug between the stack structures adjacent to each other, the common source plug extending in parallel to the stack structures; and a spacer structure between the common source plug and the stack structures, the spacer structure at each side of the common source plug, the spacer structure covering the sidewalls of the stack structures, the spacer structure including an insulating spacer and a protection spacer, the insulating spacer filling the recess regions of the sidewalls of the stack structures, a surface of the insulating spacer defining grooves, the protection spacer filling the grooves of the insulating spacer, the protection spacer being in contact with the common source plug, and the protection spacer includes a different material from the insulating spacer.

12. The 3D semiconductor device of claim 11, wherein a surface of the protection spacer that contacts the common source plug is substantially flat.

13. The 3D semiconductor device of claim 11, wherein the protection spacer includes:

a first protection spacer filling the grooves of the insulating spacer; and a second protection spacer between the first protection spacer and the common source plug and having a substantially flat surface, and the first protection spacer and the second protection spacer are formed of different materials.

14. The 3D semiconductor device of claim 11, further comprising:

a data storage layer between the vertical structures and the stack structures, wherein each of the stack structures includes insulating layers and electrodes alternately and vertically stacked on the substrate, the data storage layer includes a vertical insulating pattern and horizontal pattern, the vertical insulating pattern penetrates the stack structure to surround the vertical structures, and the horizontal insulating pattern laterally extends between the vertical insulating pattern and each of the electrodes into between the each of the electrodes and the insulating layers.

15. The 3D semiconductor device of claim 11, wherein
each of the stack structures includes insulating layers and electrodes alternately and vertically stacked on the substrate,
sidewalls of the electrodes are laterally recessed from sidewalls of the insulating layers to define the recess regions,
the insulating spacer includes first portions and second portions,
the first portions are adjacent to the electrodes,
the second portions are adjacent to the insulating layers, and
a horizontal distance between a surface of the first portions and a surface of the second portions is smaller than a horizontal distance between the sidewall of the insulating layer adjacent to the insulating spacer and the sidewall of the electrode adjacent to the insulating spacer.

16. A three-dimensional (3D) semiconductor device comprising:
a plurality of cell strings on a substrate, each of the cell strings including a plurality of memory cells stacked on top of each other between a ground selection transistor and a string selection transistor;
word lines connected to memory cells in the plurality of cell strings;
bit lines connected to the cell strings;
a common source line connected to the cell strings;
a common source plug connected to the common source line, the common source plug extending vertical to a top surface of the substrate;
a protection spacer surrounding the common source plug; and
an insulating spacer surrounding the protection spacer.

17. The 3D semiconductor device of claim 16, wherein the protection spacer includes:
a first protection spacer filling grooves defined by the insulating spacer; and
a second protection spacer between the first protection spacer and the common source plug and having a substantially flat surface.

18. The 3D semiconductor device of claim 17, wherein
the first protection spacer is formed of silicon, and
the second protection spacer is formed of silicon oxide.

19. The 3D semiconductor device of claim 16, wherein
the protection spacer includes a first surface facing the common source plug and a second surface opposite the first surface,
the first surface is substantially flat, and
the second surface includes a plurality of concave portions.

20. The 3D semiconductor device of claim 16, wherein
the insulating spacer includes first portions and second portions alternately arranged in a vertical direction,
the first portions extend further away from the common source plug than the second portions in a lateral direction, and
a thickness of the protection spacer is greater between the common source plug and the first portions compared to a thickness of the protection spacer between the common source plug and the second portions.

* * * * *